US012645334B2

(12) United States Patent
Na et al.

(10) Patent No.: US 12,645,334 B2
(45) Date of Patent: *Jun. 2, 2026

(54) DISPLAY DEVICES

(71) Applicant: SAMSUNG DISPLAY CO., LTD.,
Yongin-si (KR)

(72) Inventors: Jisu Na, Yongin-si (KR); Kwangmin Kim, Seoul (KR); Kiwook Kim, Hwaseong-si (KR); Yangwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/019,346

(22) Filed: Jan. 13, 2025

(65) Prior Publication Data

US 2025/0156019 A1     May 15, 2025

Related U.S. Application Data

(63) Continuation of application No. 18/111,595, filed on Feb. 19, 2023, now Pat. No. 12,210,715, which is a
(Continued)

(30) Foreign Application Priority Data

Sep. 12, 2018     (KR) ........................ 10-2018-0109295
Oct. 26, 2018     (KR) ........................ 10-2018-0129159

(51) Int. Cl.
*G06F 3/044*          (2006.01)
*G06F 3/041*          (2006.01)
(Continued)

(52) U.S. Cl.
CPC .......... *G06F 3/0448* (2019.05); *G06F 3/0412* (2013.01); *G09G 3/3266* (2013.01);
(Continued)

(58) Field of Classification Search
CPC .. G06F 3/0448; G06F 3/04164; G06F 3/0412; G06F 3/0446; G06F 2203/04112;
(Continued)

(56) References Cited

U.S. PATENT DOCUMENTS 8,174,471 B2     5/2012 Kim et al.
10,004,138 B2     6/2018 Kim et al.
(Continued)

FOREIGN PATENT DOCUMENTS

CN          102667685 A     9/2012
CN          106557198 A     4/2017
(Continued)

OTHER PUBLICATIONS

Extended European Search Report dated Dec. 19, 2019, issued in EP Patent Application No. 19196263.8.
(Continued)

*Primary Examiner* — Jimmy H Nguyen
(74) *Attorney, Agent, or Firm* — Womble Bond Dickinson (US) LLP

(57)          ABSTRACT

A display device including an input sensor having sensing electrodes disposed in a sensing area and signal lines. Each of the signal lines is connected to a corresponding electrode of the sensing electrodes and disposed in the line area. One signal line of the signal lines includes a first portion having a constant width, a second portion disposed outside a corner area of the sensing area, extending from the first portion, and having a width gradually increasing in a direction that is away from the first portion, a third portion extending from the second portion and having a width gradually varying in a direction that is away from the second portion, and a fourth portion extending from the third portion and having a constant width.

19 Claims, 32 Drawing Sheets

Related U.S. Application Data continuation of application No. 17/716,255, filed on Apr. 8, 2022, now Pat. No. 11,635,866, which is a continuation of application No. 17/175,851, filed on Feb. 15, 2021, now Pat. No. 11,301,105, which is a continuation of application No. 16/566,946, filed on Sep. 11, 2019, now Pat. No. 10,949,047.

(51) Int. Cl.

| | |
|---|---|
| *G09G 3/3266* | (2016.01) |
| *H10K 59/131* | (2023.01) |
| *H10K 59/40* | (2023.01) |

(52) U.S. Cl.
CPC ........... *H10K 59/131* (2023.02); *H10K 59/40* (2023.02); *G06F 3/04164* (2019.05); *G06F 3/0446* (2019.05); *G06F 2203/04111* (2013.01); *G06F 2203/04112* (2013.01)

(58) Field of Classification Search
CPC .......... G06F 2203/04111; H10K 59/00; H10K 59/131; H10K 59/40; H10K 59/65; G09G 3/3266
USPC .................................................. 345/173, 174
See application file for complete search history.

(56) References Cited

U.S. PATENT DOCUMENTS

| | | | |
|---|---|---|---|
| 10,019,088 B2 | 7/2018 | Kim et al. | |
| 10,062,739 B2 | 8/2018 | Jang et al. | |
| 10,095,349 B2 | 10/2018 | Han et al. | |
| 10,949,047 B2 | 3/2021 | Na et al. | |
| 11,301,105 B2 | 4/2022 | Na et al. | |
| 11,635,866 B2 | 4/2023 | Na et al. | |
| 12,210,715 B2 * | 1/2025 | Na ....................... | G09G 3/3266 |
| 2010/0073319 A1 | 3/2010 | Lyon et al. | |
| 2014/0374710 A1 | 12/2014 | Roh et al. | |
| 2015/0185903 A1 | 7/2015 | Park | |

| | | |
|---|---|---|
| 2016/0070394 A1 | 3/2016 | Van Ostrand et al. |
| 2016/0334910 A1 | 11/2016 | Ono et al. |
| 2017/0024060 A1 | 1/2017 | Seong et al. |
| 2017/0249039 A1 | 8/2017 | Kim |
| 2018/0182822 A1 | 6/2018 | Seo et al. |
| 2018/0190724 A1 | 7/2018 | Kang |
| 2019/0018524 A1 | 1/2019 | Shiojiri et al. |
| 2019/0312097 A1 | 10/2019 | Choi et al. |
| 2020/0142449 A1 | 5/2020 | Nakatogawa |

FOREIGN PATENT DOCUMENTS

| | | |
|---|---|---|
| EP | 3396500 | 10/2018 |
| JP | 2006047530 | 2/2006 |
| KR | 10-0906103 B1 | 7/2009 |
| KR | 10-2015-0025774 A | 3/2015 |
| KR | 10-2016-0110676 A | 9/2016 |
| KR | 10-2017-0102111 A | 9/2017 |
| KR | 10-2017-0131775 | 11/2017 |
| KR | 10-2018-0079092 | 7/2018 |
| KR | 10-2019-0117866 | 10/2019 |
| TW | 201124890 A | 7/2011 |
| TW | 201610777 | 3/2016 |
| TW | 201712500 | 4/2017 |
| WO | WO 2017110995 | 6/2017 |

OTHER PUBLICATIONS

Non-Final Office Action mailed Jun. 25, 2020, in U.S. Appl. No. 16/566,946.

Notice of Allowance mailed Nov. 23, 2020, in U.S. Appl. No. 16/566,946.

Non-Final Office Action dated Aug. 3, 2021, in U.S. Appl. No. 17/175,851.

Notice of Allowance dated Dec. 3, 2021, in U.S. Appl. No. 17/175,851.

Non-Final Office Action dated Sep. 23, 2022, in U.S. Appl. No. 17/716,255.

Notice of Allowance dated Dec. 9, 2022, in U.S. Appl. No. 17/716,255.

* cited by examiner

DISPLAY DEVICES

CROSS-REFERENCE TO RELATED APPLICATIONS

This application is a continuation of U.S. patent application Ser. No. 18/111,595, filed on Feb. 19, 2023, which is a continuation of U.S. patent application Ser. No. 17/716,255, filed on Apr. 8, 2022, now U.S. Pat. No. 11,635,866, which is a continuation of U.S. patent application Ser. No. 17/175, 851, filed on Feb. 15, 2021, now U.S. Pat. No. 11,301,105, which is a continuation of U.S. patent application Ser. No. 16/566,946, filed on Sep. 11, 2019, now U.S. Pat. No. 10,949,047, which claims priority to and the benefit of Korean Patent Application Nos. 10-2018-0109295, filed on Sep. 12, 2018, and 10-2018-0129159, filed on Oct. 26, 2018, the entire content of both of which is incorporated herein by reference.

BACKGROUND

Field

Exemplary embodiments of the inventive concept relate to a display device, and more particularly, to a display device including an input sensor.

Discussion of the Background

Various display devices used in multimedia equipment such as televisions, mobile phones, table computers, navigation devices, and game consoles are being developed. Such a display device includes a keyboard or a mouse as an input unit, and may also include a touch sensor as an input unit.

The above information disclosed in this Background section is only for understanding of the background of the inventive concept, and, therefore, it may contain information that does not constitute prior art.

SUMMARY

Exemplary embodiments of the inventive concept provide a display device including an input sensor in which signal lines have reduced resistance deviation.

Additional features of the inventive concept will be set forth in the description which follows, and in part will be apparent from the description, or may be learned by practice of the inventive concepts.

An exemplary embodiment of the inventive concept provides a display device including a display panel and an input sensor disposed above the display panel and including a sensing area and a line area. The input sensor includes a first electrode group disposed in the sensing area, a second electrode group disposed in the sensing area and crossing the first electrode group, and a first signal line group disposed in the line area and electrically connected to the first electrode group. Each of signal lines of the first signal line group includes a first portion having a constant width, a second portion disposed outside a corner area of the sensing area, extending from the first portion, and having a width gradually increasing in a direction that is away from the first portion, a third portion extending from the second portion and having a width gradually varying in a direction that is away from the second portion, and a fourth portion extending from the third portion and having a constant width.

The first electrode group may include 1-th to i-th (where i is a natural number of 2 or more) electrodes arranged away from a pad area defined at one side of the line area in a first direction and extending in a second direction crossing the first direction. The signal lines of the first signal line group may include 1-th to k-th (where k is the largest natural number of natural numbers equal to or less than i/2) signal lines. The 1-th to k-th signal lines may be sequentially connected to or odd-numbered even-numbered electrodes of the 1-th to i-th electrodes.

The first portions of the 1-th to k-th signal lines may have widths that increase from the 1-th signal line toward the k-th signal line.

The third portion of the 1-th signal line may have a width gradually increasing as the third portion of the 1-th signal line is adjacent to the fourth portion of the 1-th signal line.

The third portion of the k-th signal line may have a width gradually decreasing as the third portion of the k-th signal line is adjacent to the fourth portion of the k-th signal line.

The fourth portions of the 1-th to k-th signal lines may have the same width.

The input sensor may further include a connection electrode connecting the fourth portion of the 1-th signal line to a corresponding electrode of the 1-th to i-th electrodes.

The connection electrode and the 1-th signal line may be disposed with an insulation layer therebetween, and the insulation layer may be disposed below the 1-th signal line and the corresponding electrode. Each of the fourth portion of the 1-th signal line and the corresponding electrode may be connected to the connection electrode through connection contact holes passing through the insulation layer.

A dummy pattern may be disposed between the corresponding electrode and the fourth portion of the 1-th signal line on the plane. The dummy pattern may be spaced apart from each of the corresponding electrode and the fourth portion of the 1-th signal line, and the dummy pattern may overlap the connection electrode.

The fourth portion of the 1-th signal line may be directly connected to a corresponding electrode of the 1-th to i-th electrodes.

Each of the 1-th to k-th signal lines may further include a pad portion extending from the first portion in the first direction to partially overlap the pad area.

The pad portions of the 1-th to k-th signal lines may have the same width.

Each of the 2-th to k-th signal lines may further include: a fifth portion extending from the fourth portion and having a width that gradually increases in a direction that is away from the fourth portion; and a sixth portion extending from the fifth portion and having a constant width.

The sixth portions of the 2-th to k-th signal lines may have the same width.

A width of an area of the line area in which the fourth portions of the 1-th to k-th signal lines are disposed and a width of an area of the line area in which the sixth portions of the 2-th to k-th signal lines are disposed may be substantially the same.

The sixth portion may have a width greater than that of the fourth portion.

The k-th signal line may further include an extension portion extending from the fourth portion, and the extension portion may include a plurality of portions distinguished from each other. A width of an area of the line area in which the fourth portions of the 1-th to k-th signal lines are disposed and a width of an area of the line area in which a portion of the plurality of portions of the extension portion may be substantially the same. The portion of the plurality of portions of the extension portion is farthest away from the fourth portion of the k-th signal line.

The second portion is disposed outside a corner area of the sensing area.

The second portion may have a curved shape or at least one inflection point at which the extension direction is changed.

Another exemplary embodiment of the inventive concept provides a display device including a display panel and an input sensor disposed above the display panel and including a sensing area and a line area. The input sensor includes sensing electrodes disposed in the sensing area and signal lines each of which is connected to a corresponding electrode of the sensing electrodes and which are disposed in the line area. One signal line of the signal lines includes a first portion having a constant width, a second portion disposed outside a corner area of the sensing area, extending from the first portion, and having a width gradually increasing in a direction that is away from the first portion, a third portion extending from the second portion and having a width gradually varying in a direction that is away from the second portion, and a fourth portion extending from the third portion and having a constant width.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 5A is an enlarged cross-sectional view of the display panel according to an exemplary embodiment of the inventive concept.

FIG. 9A is a partial plan view of an input sensing layer according to an exemplary embodiment of the inventive concept.

DETAILED DESCRIPTION

Figure 1:
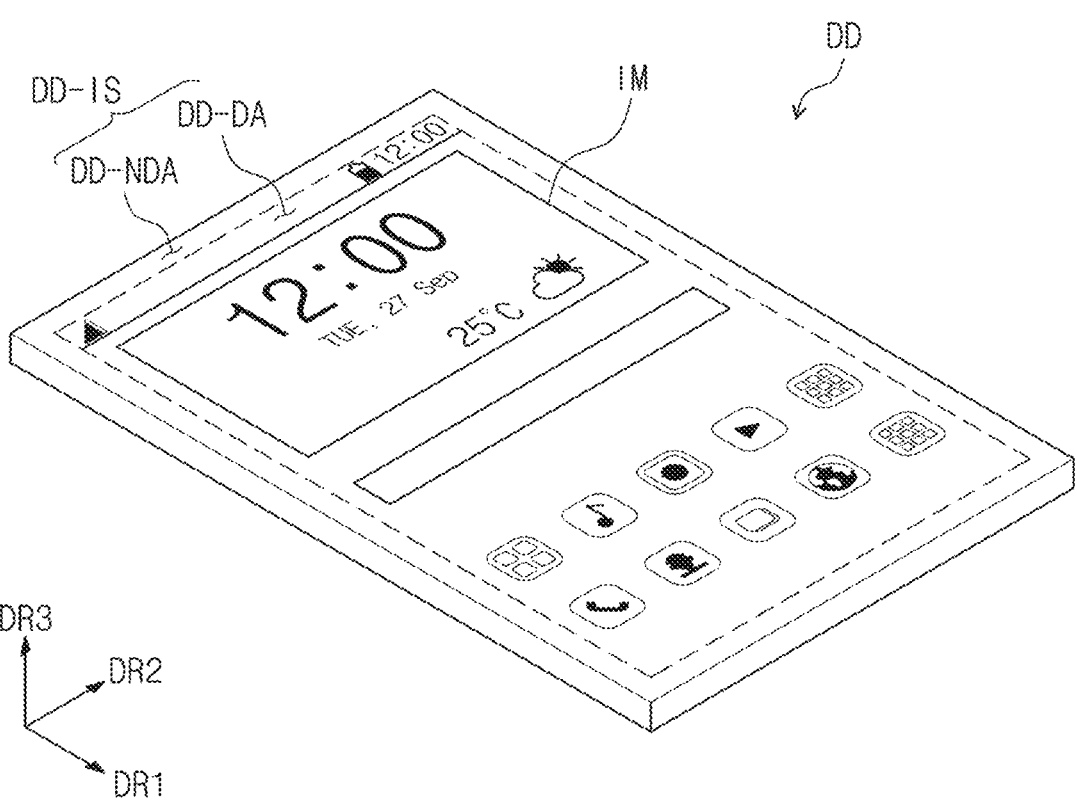
FIG. 1 is a perspective view of a display device according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device DD according to an exemplary embodiment of the inventive concept. Referring to FIG. 1, the display device DD may display an image IM through a display surface DD-IS. The display surface DD-IS is parallel to a surface defined by a first directional axis DR1 and a second directional axis DR2. A normal direction of the display surface DD-IS, i.e., a thickness direction of the display device DD is indicated as a third directional axis DR3.

A front surface (or a top surface) and a rear surface (or a bottom surface) of each of members or units, which will be described below, are distinguished by the third directional axis DR3. However, the first to third directional axes DR1, DR2, and DR3 illustrated in this exemplary embodiment may be merely examples. Hereinafter, first to third directions may be directions indicated by the first to third directional axes DR1, DR2, and DR3, and designated by the same reference numerals, respectively.

Although the display device DD having a planar display surface is illustrated in an exemplary embodiment of the inventive concept, the inventive concept is not limited thereto. The display device DD may include a curved display surface or a solid display surface. The solid display surface may include a plurality of display areas that indicate different directions. For example, the solid display surface may include a polygonal column-type display surface.

The display device DD according to the current exemplary embodiment may be a rigid display device DD. However, the inventive concept is not limited thereto. For example, the display device DD may be a flexible display device DD. The flexible display device DD may include a foldable display device or a banding type display device of which a portion area is bendable.

According to this exemplary embodiment, the display device DD that is capable of being applied to a mobile terminal is exemplarily illustrated. Although not shown, electronic modules, a camera module, a power module, and the like, which are mounted on a main board, may be disposed on a bracket/case together with the display device DD to constitute the mobile terminal. The display device DD according to the inventive concept may be applied to large-sized electronic devices such as televisions and monitors and small and middle-sized electronic devices such as tablet PC, navigation units for vehicles, game consoles, and smart watches.

As illustrated in FIG. 1, the display surface DD-IS includes an image area DD-DA in which an image IM is displayed and a bezel area DD-NDA adjacent to the image area DD-DA. The bezel area DD-NDA may be an area in which an image is not displayed. FIG. 1 illustrates an icon as an example of the image IM.

As illustrated in FIG. 1, the image area DD-DA may have a substantially rectangular shape. The "substantially rectangular shape" includes not only a rectangular shape as a mathematical sense but also a rectangular shape in which a vertex is not defined in a vertex area (or a corner area) but a boundary of a curve is defined.

The bezel area DD-NDA may surround the image area DD-DA. However, the inventive concept is not limited thereto. For example, the image area DD-DA and the bezel area DD-NDA may be relatively designed in shape.

FIGS. 2A to 2D are cross-sectional views of the display device DD according to an exemplary embodiment of the inventive concept. FIGS. 2A to 2D illustrate cross-sections defined by the second directional axis DR2 and the third directional axis DR3. FIGS. 2A to 2D are simply illustrated to explain a lamination relationship of functional members constituting the display device DD.

The display device DD according to an exemplary embodiment of the inventive concept may include a display panel, an input sensor, an anti-reflector, and a window. At least portions of the display panel, the input sensor, the anti-reflector, and the window may be formed through a continuous process, and at least portions may be coupled to each other through an adhesion member. FIGS. 2A to 2D illustrate an optically clear adhesive (OCA) as an example of the adhesion member. Hereinafter, the adhesion member may include a general adhesive or adhesive agent. In an exemplary embodiment of the inventive concept, the anti-reflector and the window may be replaced with different constituents or omitted.

In FIGS. 2A to 2D, a corresponding constituent of the input sensor, the anti-reflector, and the window, which is formed with respect to the other constituent through the continuous process, may be expressed as a "layer". Also, a constituent of the input sensor, the anti-reflector, and the window, which is coupled to the other constituent through the adhesion member, may be expressed as a "panel". The "panel" may include a base layer providing a base surface, for example, a synthetic film, a complex material film, a glass substrate, and the like, but the base layer may be omitted in the "layer". That is to say, the units expressed as the "layer" may be disposed on the base surface provided by the other unit.

Here, the input sensor, the anti-reflector, and the window may be called an input sensing panel ISP, an anti-reflection panel RPP, and a window panel WP or an input sensing layer ISL, an anti-reflection layer RPL, and a window layer WL.

Figure 2A:
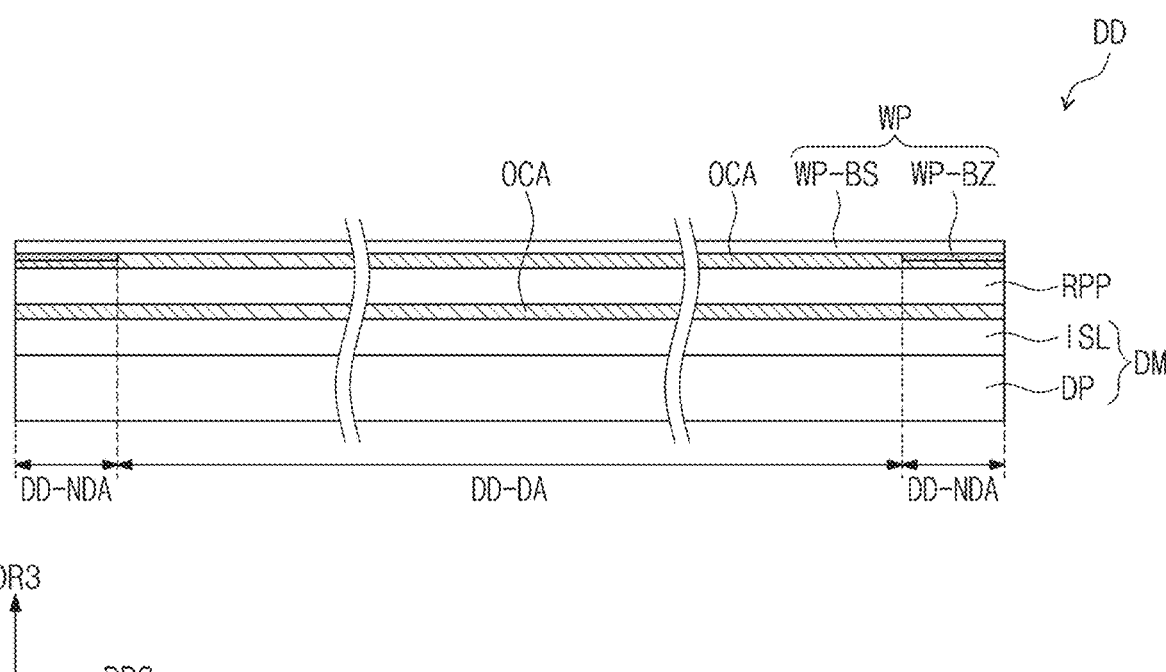
FIGS. 2A, 2B, 2C, and 2D are cross-sectional views of the display device according to an exemplary embodiment of the inventive concept.

As illustrated in FIG. 2A, the display device DD may include a display panel DP, an input sensing layer ISL, an anti-reflection panel RPP, and a window panel WP. The input sensing layer ISL may be directly disposed on the display panel DP. In this specification, that "a constituent B is directly disposed on a constituent A" may mean that a separate adhesive layer/adhesive member is not disposed between the constituents A and B. The constituent B may be formed through the continuous process on the base surface provided by the constituent A after the constituent A is formed.

The display panel DP and the input sensing layer ISL directly disposed on the display panel DP may be defined as a display module DM. An optically clear adhesive (OCA) is disposed between the display module DM and the anti-reflection panel RPP and between the anti-reflection panel RPP and the window panel WP.

The display panel DP generates an image, and the input sensing layer ISL acquires coordinate information of an external input (for example, a touch event). Although not separately shown, the display module DM according to an exemplary embodiment of the inventive concept may further include a protection member disposed on a bottom surface of the display panel DP. The protection member and the display panel DP may be coupled to each other through an adhesion member. The display devices DD of FIGS. 2B to 2D, which will be described below, may also further include the protection member.

The display panel DP according to an exemplary embodiment of the inventive concept may be an emission type display panel, but is not limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

The anti-reflection panel RPP reduces reflectance of external light incident from an upper side of the window panel WP. The anti-reflection panel RPP according to an exemplary embodiment of the inventive concept may include a retarder and a polarizer. The retarder may be a film type or liquid crystal coating type retarder and may include a $\lambda/2$ retarder and/or a $\lambda/4$ retarder. The polarizer may also be a film type or liquid crystal coating type polarizer. The film type may include an elongation-type synthetic resin, and the liquid crystal coating type may include liquid crystals that are arranged in a predetermined arrangement. Each of the retarder and the polarizer may further include a protection film. The retarder and polarizer itself or the protection film may be defined as a base layer of the anti-reflection panel RPP.

The anti-reflection panel RPP according to an exemplary embodiment of the inventive concept may include color filters. The color filters may have predetermined arrangement. The color filters may be determined in arrangement in consideration of colors of light emitted from pixels provided in the display panel DP. The anti-reflection panel RPP may further include a black matrix adjacent to the color filters.

The anti-reflection panel RPP according to an exemplary embodiment of the inventive concept may include a destructive interference structure. For example, the destructive interference structure include first reflection layer and a second reflection layer, which are disposed on layers different from each other. First reflected light and second reflected light, which are respectively reflected from the first reflection layer and the second reflection layer, may destructively interfere, and thus, the external light may be reduced in reflectance.

The window panel WP according to an exemplary embodiment of the inventive concept includes a base layer WP-BS and a light blocking pattern WP-BZ. The base layer WP-BS may include a glass substrate and/or a synthetic film. The base layer WP-BS is not limited to a single layer. The base layer WP-BS may include two or more films that are coupled to each other through the adhesion member.

The light blocking pattern WP-BZ partially overlaps the base layer WP-BS. The light blocking pattern WP-BZ may be disposed on a rear surface of the base layer WP-BS. The light blocking pattern WP-BZ may substantially define the bezel area DD-NDA of the display device DD. An area in which the light blocking pattern WP-BZ is not disposed may be defined as the image area DD-DA of the display device DD. When limited to the window panel WP, an area in which the light blocking pattern WP-BZ is disposed may be defined as a light blocking area of the window panel WP, and an area in which the light blocking pattern WP-BZ is not disposed may be defined as a transmission area of the window panel WP.

The light blocking pattern WP-BZ may have a multilayered structure. The multilayered structure may include a colored color layer and a black light blocking layer. The colored color layer and the black light blocking layer may be formed through deposition, printing, and coating processes. Although not shown, the window panel WP may further include a functional coating layer disposed on an entire surface of the base layer WP-BS. The functional coating layer may include an anti-fingerprint layer, an anti-reflection layer, a hard coating layer, and the like. Hereinafter, referring to FIGS. 2B to 2D, the window panel WP and the window layer WL will be simply illustrated without distinguishing the base layer WP-BS and the light blocking pattern WP-BZ from each other.

Figure 2B:
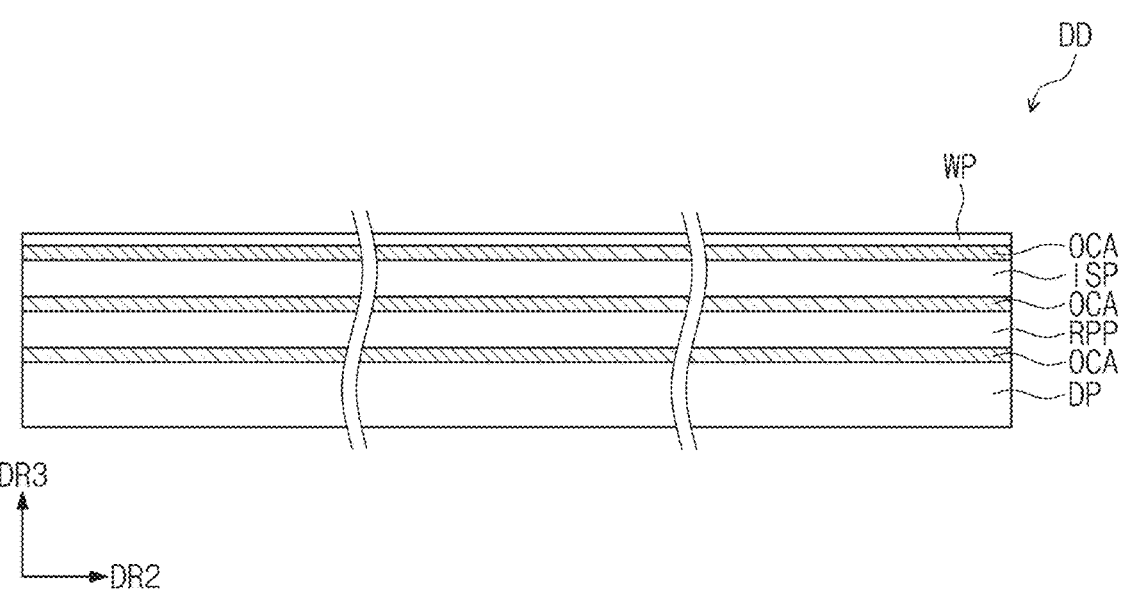
Figure 2C:
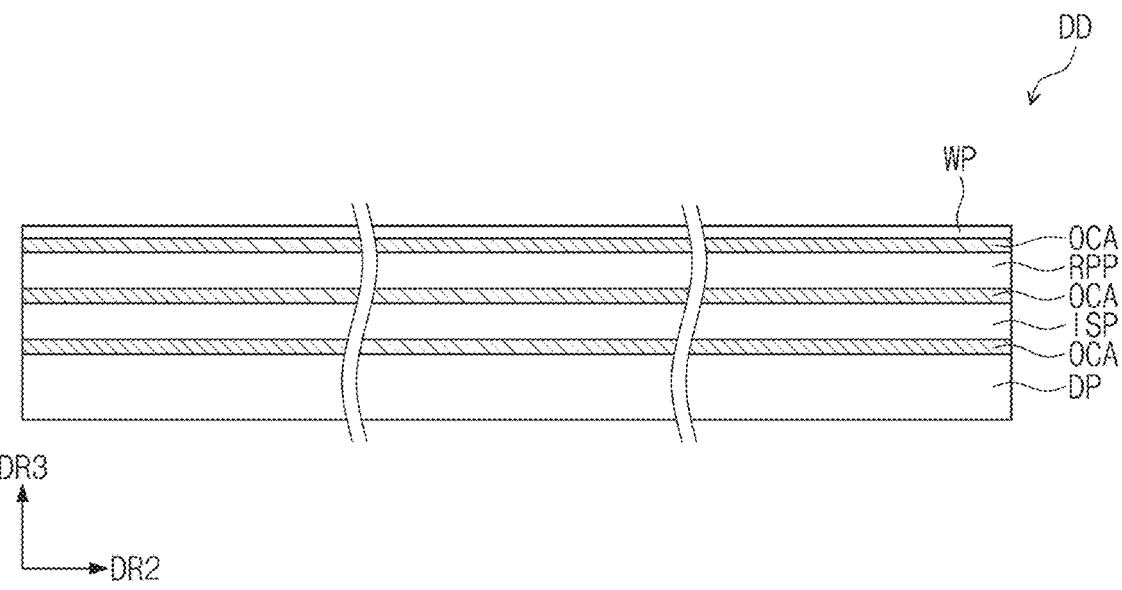

As illustrated in FIG. 2C, the display device DD may include the display panel DP, the input sensing panel ISP, the anti-reflection panel RPP, and the window panel WP. A laminated order of the input sensing panel ISP and the anti-reflection panel RPP may be changed, as shown in FIG. 2B.

Figure 2D:
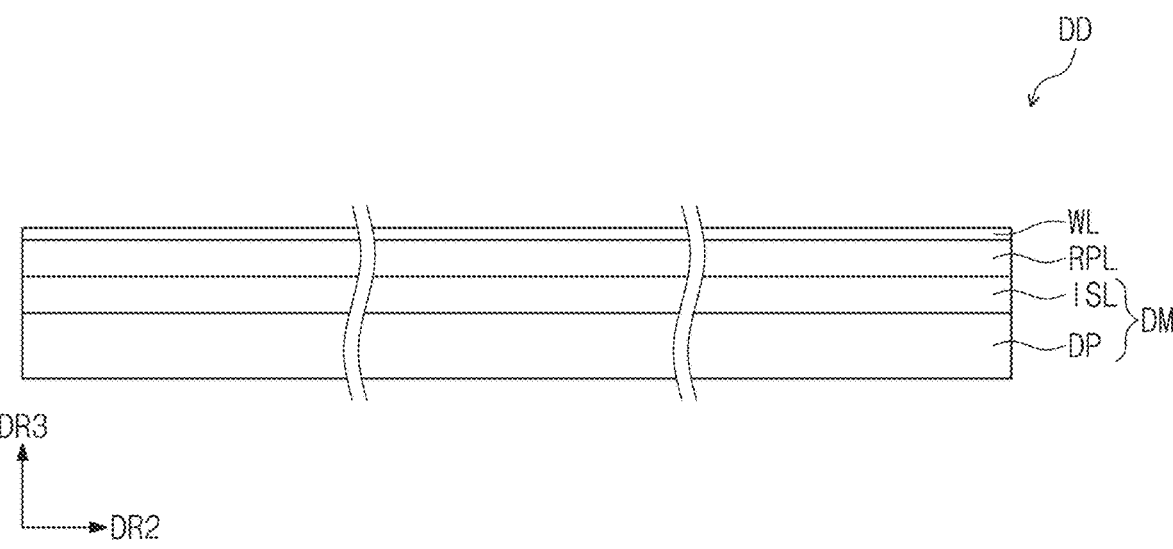

As illustrated in FIG. 2D, the display device DD may include the display panel DP, the input sensing layer ISL, the anti-reflection layer RPL, and the window layer WL. When compared with the display device DD of FIG. 2A, the optically clear adhesives (OCA) may be omitted, and the input sensing layer ISL, the anti-reflection layer RPL, and the window layer WL may be formed on the base surface provided by the display panel DP through the continuous process. A laminated order of the input sensing layer ISL and the anti-reflection layer RPL may be changed.

Figure 3A:
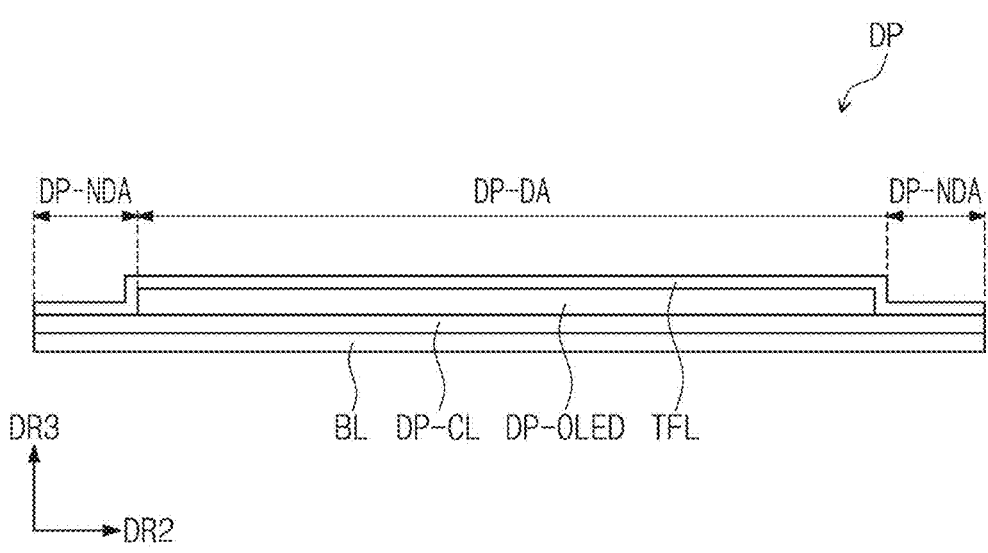
FIGS. 3A and 3B are cross-sectional views of a display panel according to an exemplary embodiment of the inventive concept.
Figure 3B:
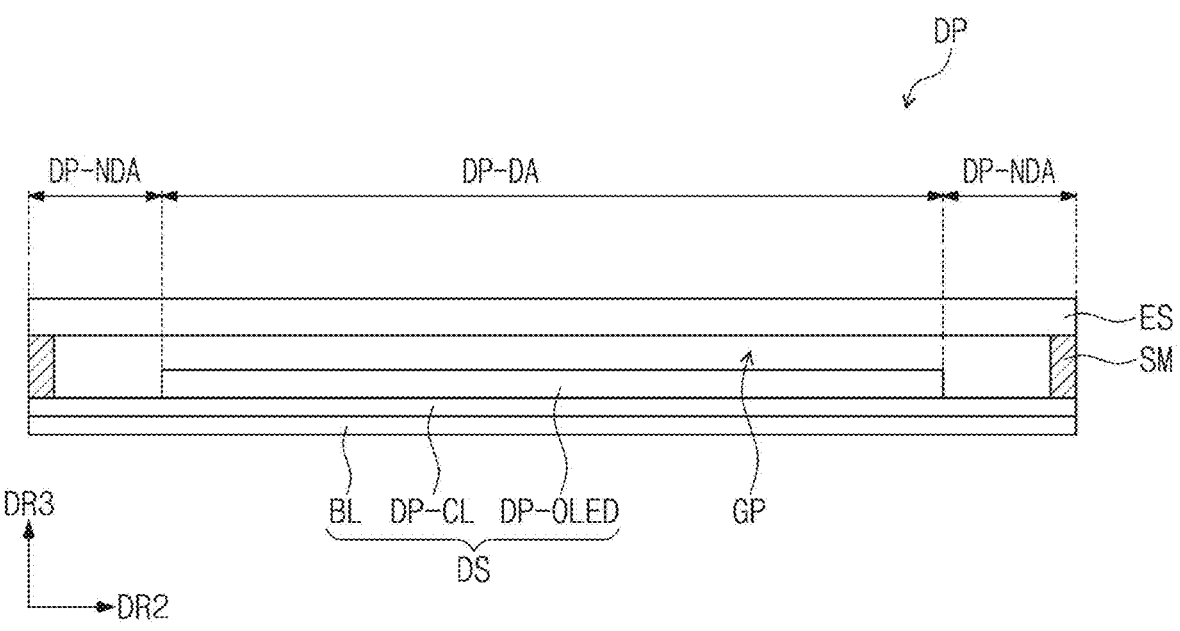

FIGS. 3A and 3B are cross-sectional views of the display panel DD according to an exemplary embodiment of the inventive concept.

As illustrated in FIG. 3A, the display panel DP may include a base layer BL, a circuit element layer DP-CL disposed on the base layer BL, a display element layer DP-OLED, and an upper insulation layer TFL. A display area DP-DA and a non-display area DP-NDA, which correspond to the image area DD-DA and the bezel area DD-NDA of FIG. 1, may be defined. In this exemplary embodiment, that an area corresponds to an area means that the areas overlap each other and have the same surface area/shape, but is not limited thereto.

The base layer BL may include at least one plastic film. The base layer BL may include a plastic substrate, a glass substrate, a metal substrate, and an organic/inorganic composite substrate.

The circuit element layer DP-CL includes at least one insulation layer and a circuit element. The insulation layer includes at least one inorganic film and at least one organic film. The circuit element includes signal lines, a driving circuit of the pixel, and the like, which will be described later in detail.

The display element layer DP-OLED may include organic light emitting diodes. The display element layer DP-OLED may further include an organic film such as a pixel defining layer.

The upper insulation layer TFL may include a plurality of thin films. One portion of the thin films may be disposed to improve optical efficiency, and the portion of the thin film may be disposed to protect the organic light emitting diodes. The upper insulation layer TFL will be described later in detail.

As illustrated in FIG. 3B, the display panel DP may include a base layer BL, a circuit element layer DP-CL disposed on the base layer BL, a display element layer DP-OLED, an encapsulation layer ES, and a sealant SM coupling the base layer BL to the encapsulation layer ES. The encapsulation layer ES may be spaced a predetermined gap GP from the display element layer DP-OLED. Each of the base layer BL and the encapsulation layer ES may include a plastic substrate, a glass substrate, a metal substrate, and an organic/inorganic composite substrate. The sealant SM may include an organic adhesion member or frit.

Figure 4:
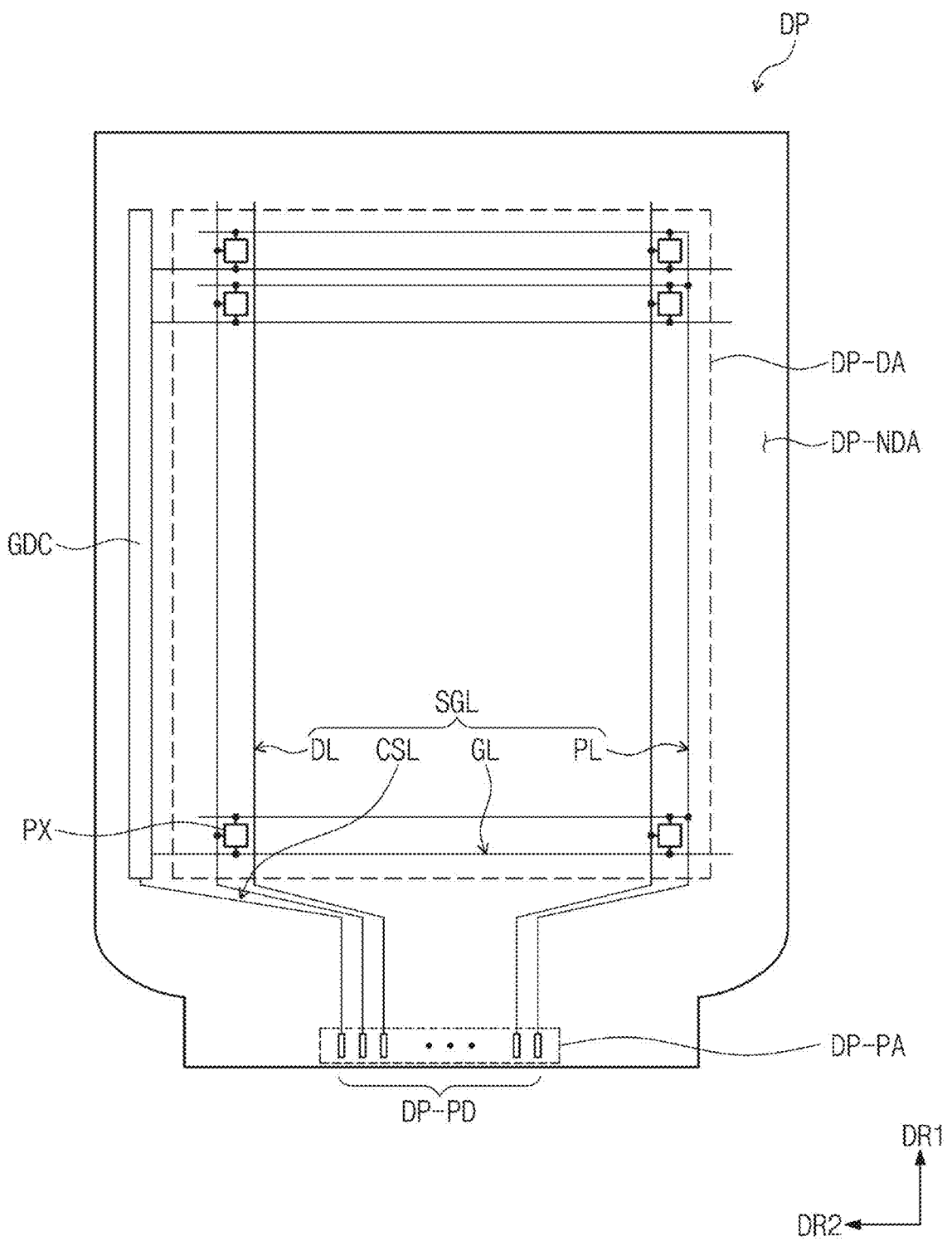
FIG. 4 is a plan view of a display panel according to an exemplary embodiment of the inventive concept.
Figure 5A:
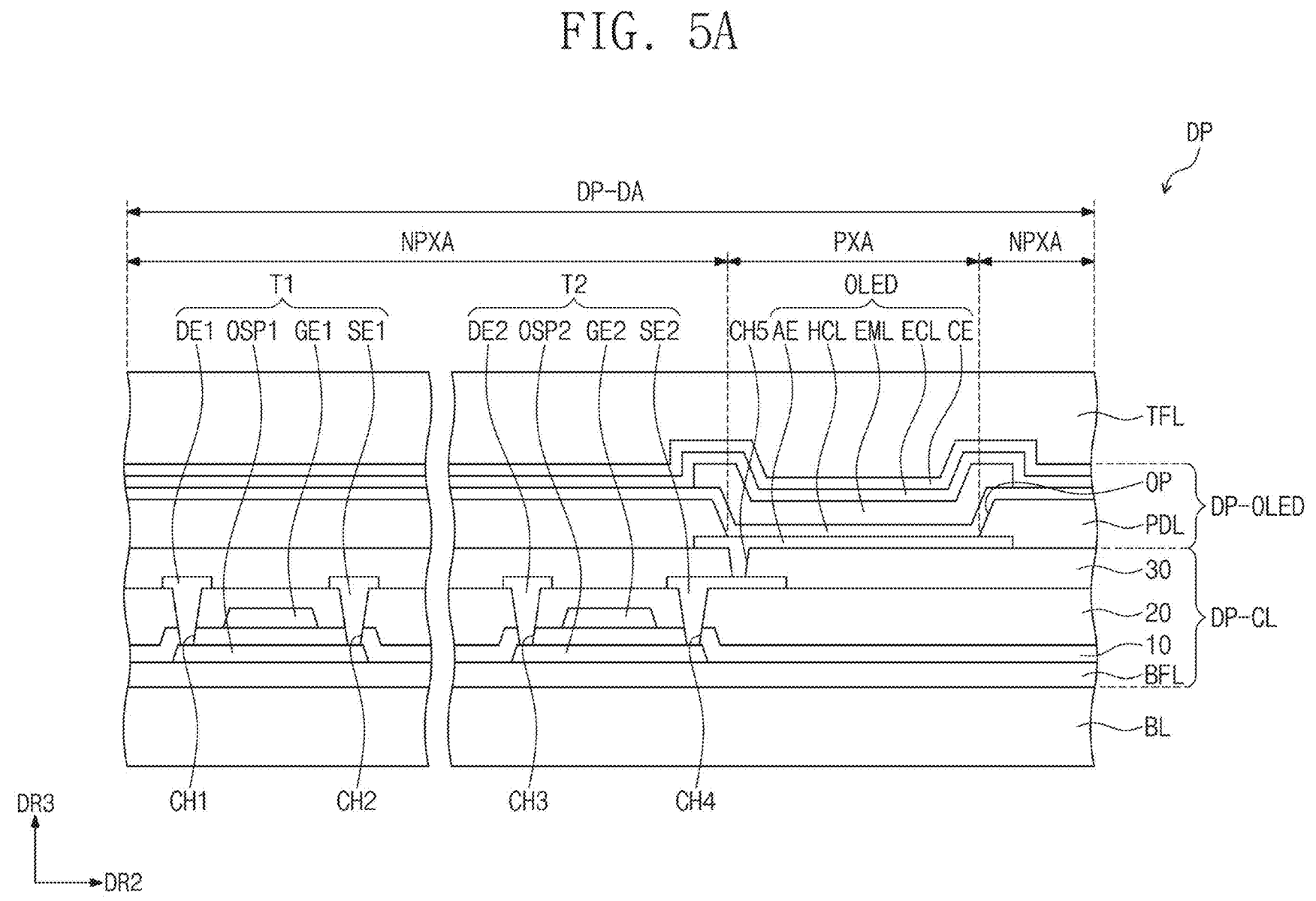
Figure 5B:
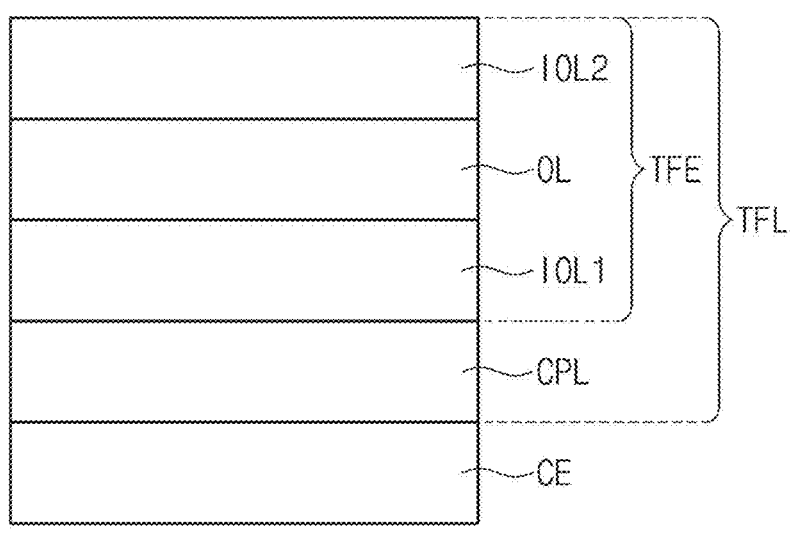
FIG. 5B is an enlarged cross-sectional view of an upper insulation layer according to an exemplary embodiment of the inventive concept.

FIG. 4 is a plan view of a display panel DP according to an exemplary embodiment of the inventive concept. FIG. 5A is an enlarged cross-sectional view of the display panel DP according to an exemplary embodiment of the inventive concept. FIG. 5B is an enlarged cross-sectional view of an upper insulation layer TFL according to an exemplary embodiment of the inventive concept. The display panel DP of FIG. 5A is illustrated based on the display panel DP of FIG. 3A.

As illustrated in FIG. 4, the display panel DP may include a driving circuit GDC, a plurality of signal lines SGL (hereinafter, referred to as "signal lines"), a plurality of signal pads DP-PD (hereinafter, referred to as "signal pads"), and a plurality of pixels PX (hereinafter, referred to as "pixels").

The display area DP-DA may be defined as an area in which the pixels PX are disposed. Each of the pixels PX includes an organic light emitting diode and a pixel driving circuit connected to the organic light emitting diode. The circuit element layer DP-CL of FIGS. 3A and 3B may include the driving circuit GDC, the signal lines SGL, the signal pads DP-PD, and a pixel driving circuit (not shown).

The driving circuit GDC may include a scan driving circuit. The scan driving circuit generates a plurality of scan signals (hereinafter, referred to as scan signals) to sequentially output the scan signals to a plurality of scan lines GL (hereinafter, referred to as scan lines) that will be described later. The scan driving circuit may further output other control signals to the driving circuit of each of the pixels PX.

The scan driving circuit may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL includes scan lines GL, data lines DL, a power line PL, and a control signal line CSL. The scan lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

The signal lines SGL overlap the display area DP-DA and the non-display area DP-NDA. The signal lines SGL may include a pad part and a line part. The line part overlaps the display area DP-DA and the non-display area DP-NDA. The pad part is disposed on an end of the line part. The pad part is disposed in the non-display area DP-NDA to overlap a corresponding signal pad of the signal pads DP-PD. An area of the non-display area NDA, in which the signal pads DP-PD are disposed, may be defined as a pad area DP-PA. The pad area DP-PA may be connected to a circuit board (not shown).

Substantially, the line part connected to the pixel PX may constitute most of the signal lines SGL. The line part is connected to the transistors T1 and T2 (see FIG. 5A) of the pixel PX. The line part may have a single/multilayered structure. The line part may be a single body or include two or more portions. The two or more portions may be disposed on layers different from each other and connected to each other a contact hole passing through the insulation layer disposed between the two portions.

FIG. 5A illustrates a partial cross-section of the display panel DP corresponding to the transistors T1 and T2 and the organic light emitting diode OLED. The circuit element layer DP-CL disposed on the base layer BL includes at least one insulation layer and a circuit element. The circuit element includes the signal line and the driver circuit of the pixel PX. The circuit element layer DP-CL may be formed through a process of forming an insulation layer, a semiconductor layer, and a conductive layer by coating or deposition and a process of patterning the insulation layer, the semiconductor layer, and the conductive layer by a photolithography process.

In this exemplary embodiment, the circuit element layer DP-CL may include a buffer layer BFL, a first inorganic layer 10, and a second inorganic layer 20, which are inorganic layers, and an organic layer 30. The buffer layer BFL may include a plurality of laminated inorganic layers. FIG. 5A illustrates an example of an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which constitute the switching transistor T1 and the driving transistor T2. First to fourth through-holes CH1 to CH4 are illustrated exemplarily.

The display element layer DP-OLED may include an organic light emitting diode OLED. The display element layer DP-OLED includes a pixel defining layer PDL. For example, the pixel defining layer PDL may be an organic layer.

A first electrode AE is disposed on the organic layer 30. The first electrode AE is connected to the second output electrode SE2 through the fifth through-hole CH5 passing through the organic layer 30. An opening OP is defined in the pixel defining layer PDL. The opening OP of the pixel defining layer PDL exposes at least a portion of the first electrode AE. The opening OP of the pixel defining layer PDL is called a "light emitting opening" to be distinguished from other openings.

As illustrated in FIG. 5A, the display area DP-DA may include an emission area PXA and a non-emission area NPXA adjacent to the emission area PXA. The non-emission area NPXA may surround the emission area PXA. In the current exemplary embodiment, the emission area PXA may be defined to correspond to a portion of an area of the first electrode AE exposed by the light emitting opening OP.

A hole control layer HCL may be commonly disposed in the emission area PXA and the non-emission area NPXA. The hole control layer HCL may include a hole transport layer and may further include a hole injection layer. The emission layer EML is disposed on the hole control layer HCL. The emission layer EML may be disposed on an area corresponding to the light emitting opening OP. That is, the emission layer EML may be formed to be separated from each of the pixels PX. Also, the emission layer EML may include an organic material and/or an inorganic material. The emission layer EML may generate light having a predetermined color.

An electronic control layer ECL is disposed on the emission layer EML. The electron control layer ECL may include an electron transport layer and may further include an electron injection layer. The hole control layer HCL and the electron control layer ECL may be formed commonly over the plurality of pixels PX, or the hole control layer HCL and the electron control layer ECL may be discretely formed for the plurality of pixels PX by using an open mask. A second electrode CE is disposed on the electronic control layer ECL. The second electrode CE is provided as a single body and commonly disposed over the plurality of pixels PX.

As illustrated in FIGS. 5A and 5B, the upper insulation layer TFL is disposed on the second electrode CE. The upper insulation layer TFL may include a plurality of thin films. According to this exemplary embodiment, the upper insulation layer TFL may include a capping layer CPL and a thin film encapsulation layer TFE. The thin film encapsulation layer TFE may include a first inorganic layer IOL1, an organic layer OL, and a second inorganic layer IOL2.

The capping layer CPL is disposed on the second electrode CE to contact the second electrode CE. The capping layer CPL may include an organic material. The first inorganic layer IOL1 is disposed on the capping layer CPL to contact the capping layer CPL. The organic layer OL is disposed on the first inorganic layer IOL1 to contact the first inorganic layer IOL1. The second inorganic layer IOL2 may be disposed on the organic layer OL to contact the organic layer OL.

The capping layer CPL may protect the second electrode CE from a follow-up process, for example, a sputtering process and improve emission efficiency of the organic light emitting diode OLED. The capping layer CPL may have a refractive index greater than that of the first inorganic layer IOL1.

The first inorganic layer IOL1 and the second inorganic layer IOL2 may protect the display element layer DP-OLED from oxygen/moisture, and the organic layer OL may protect the display element layer DP-OLED from foreign substances such as dust particles. Each of the first inorganic layer IOL1 and the second inorganic layer IOL2 may be one of a silicon oxide layer, a silicon nitride layer, and a silicon oxynitride layer. According to an exemplary embodiment, each of the first inorganic layer IOL1 and the second inorganic layer IOL2 may include a titanium oxide layer, an aluminum oxide layer, and the like. The organic layer OL may include an acrylic-based organic layer, but is not limited thereto.

According to an exemplary embodiment of the inventive concept, an inorganic layer, for example, an LiF layer may be further disposed between the capping layer CPL and the first inorganic layer IOL1. The LiF layer may improve the emission efficiency of the organic light emitting diode OLED.

Figure 6A:
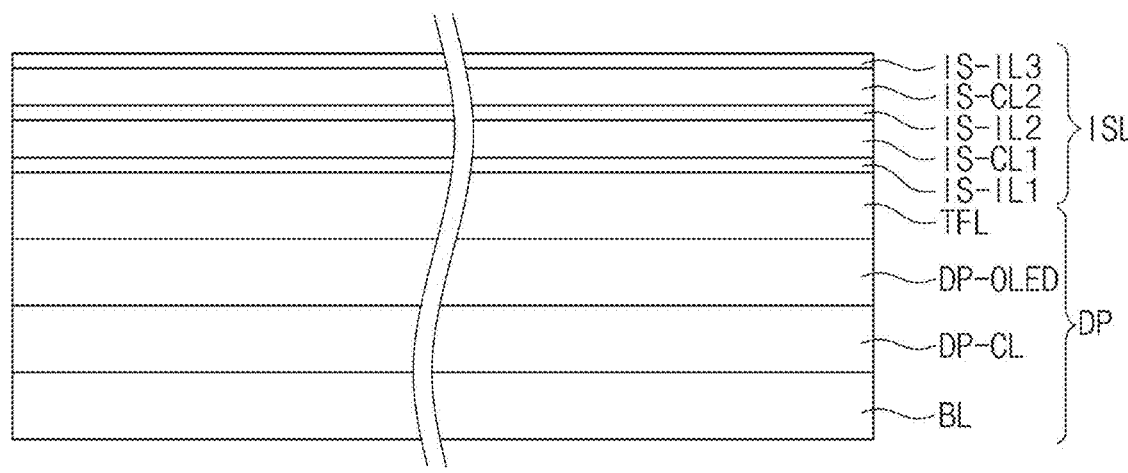
FIG. 6A is a cross-sectional view of an input sensing layer according to an exemplary embodiment of the inventive concept.
Figure 6A:
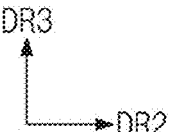
Figure 6B:
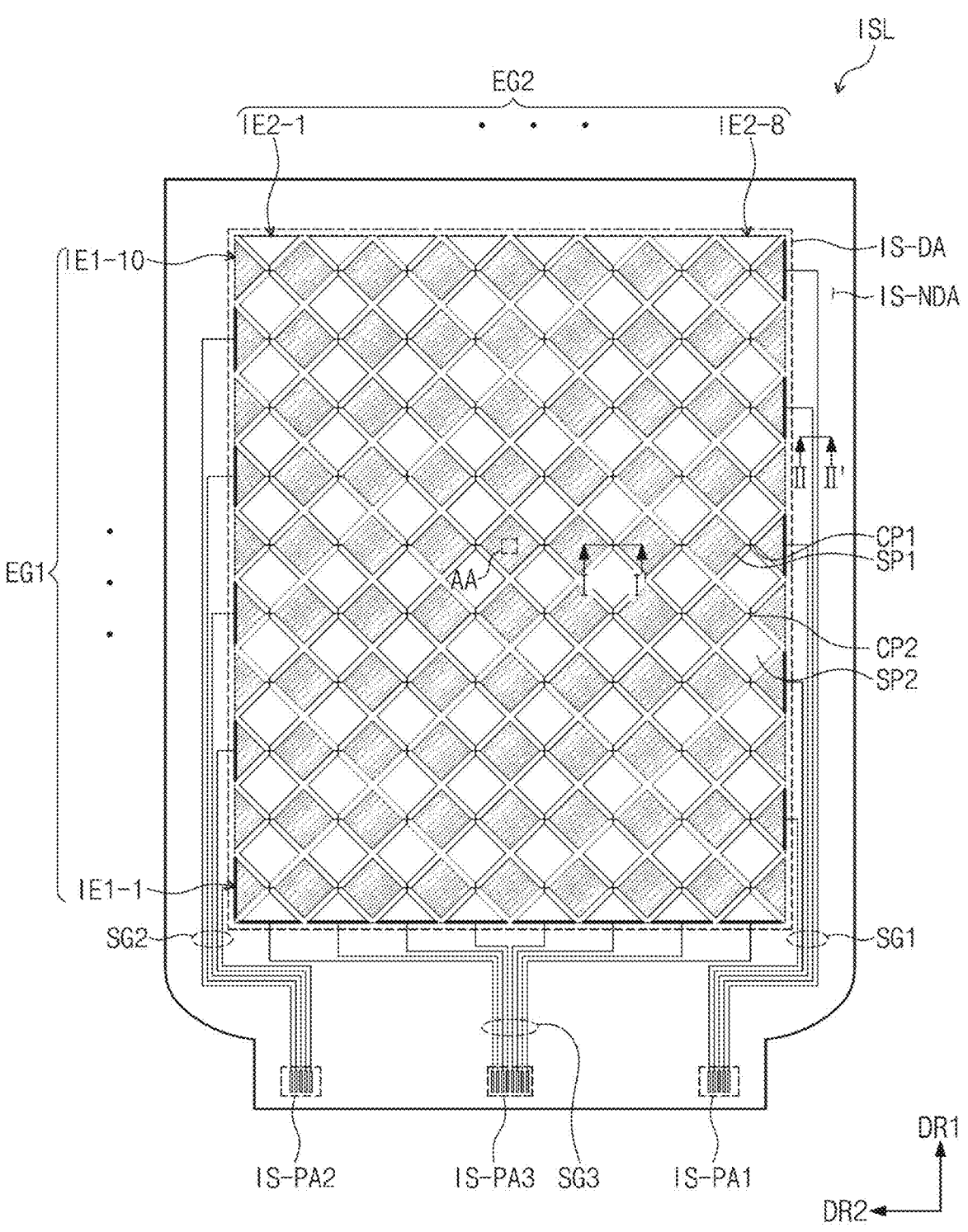
FIG. 6B is a plan view of the input sensing layer according to an embodiment of the inventive concept.
Figure 6C:
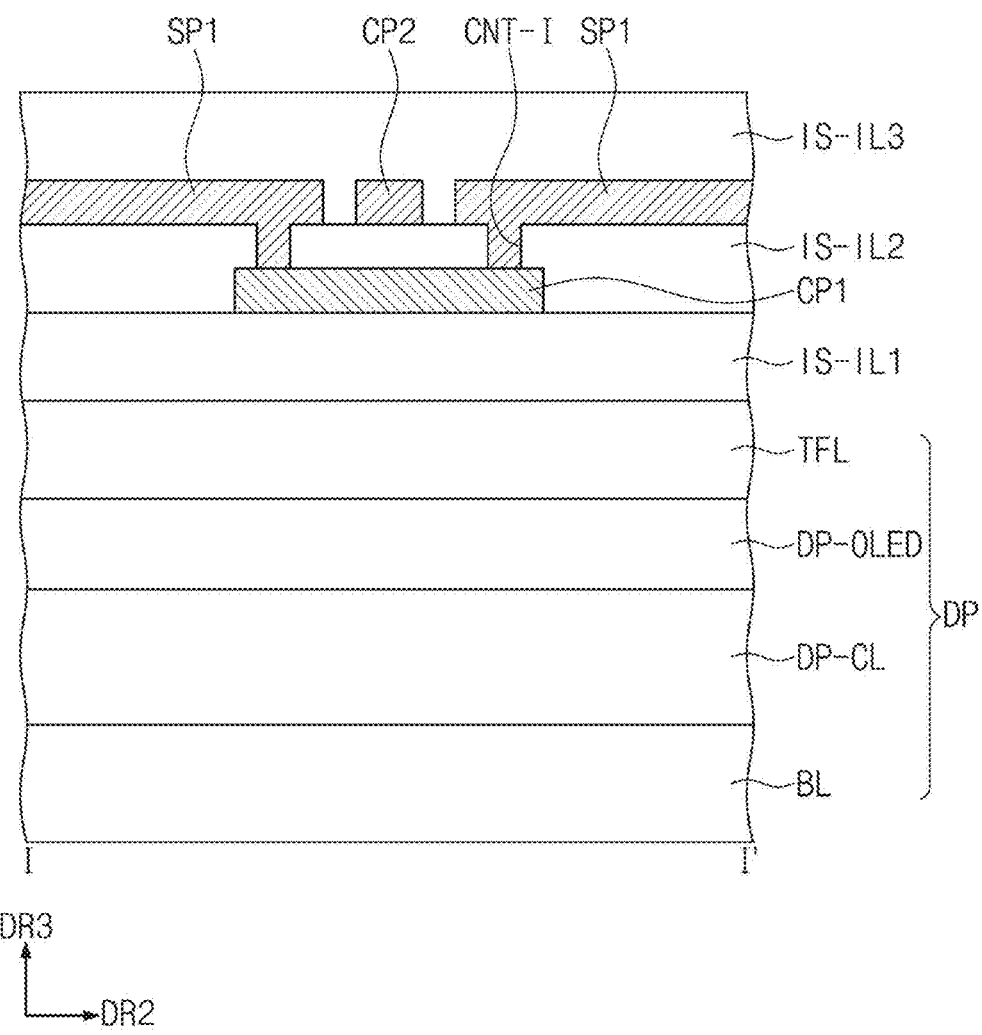
FIGS. 6C and 6D are partial cross-sectional views of the input sensing layer according to an exemplary embodiment of the inventive concept.
Figure 6D:
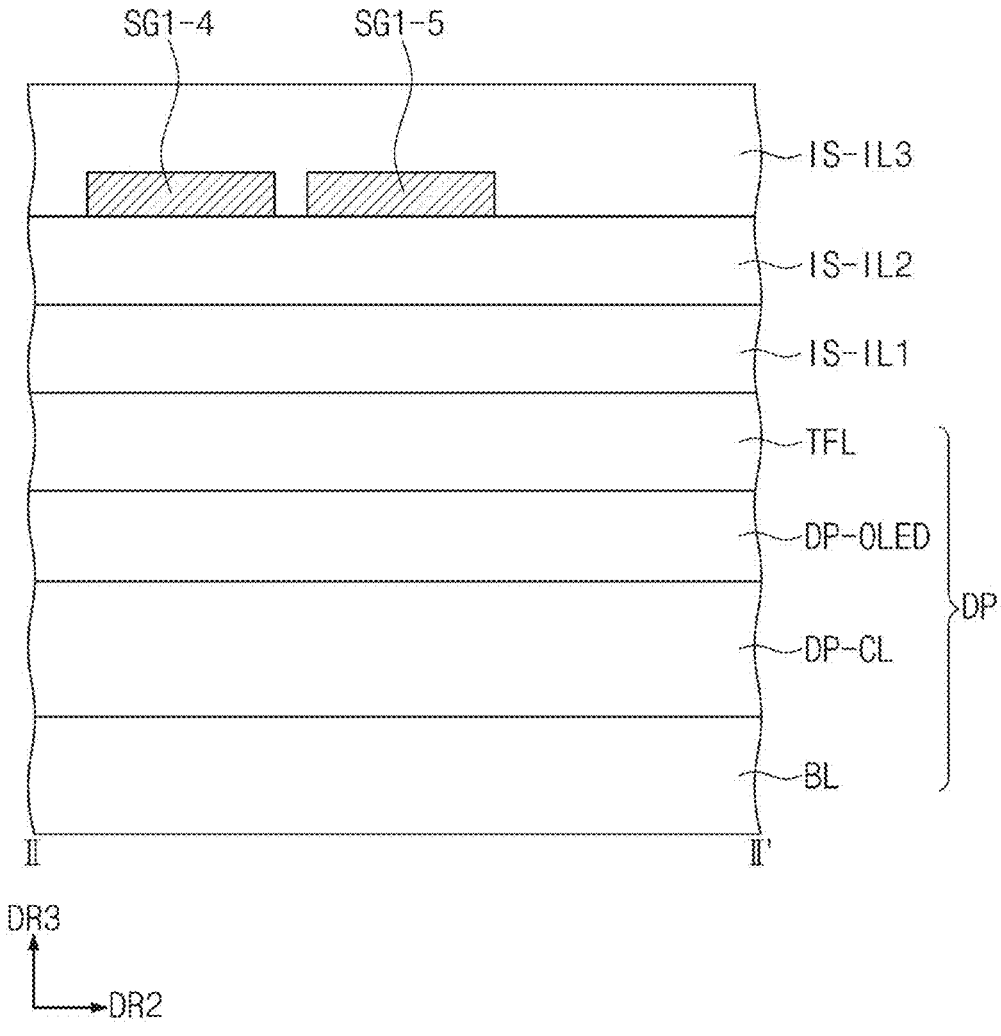
Figure 6E:
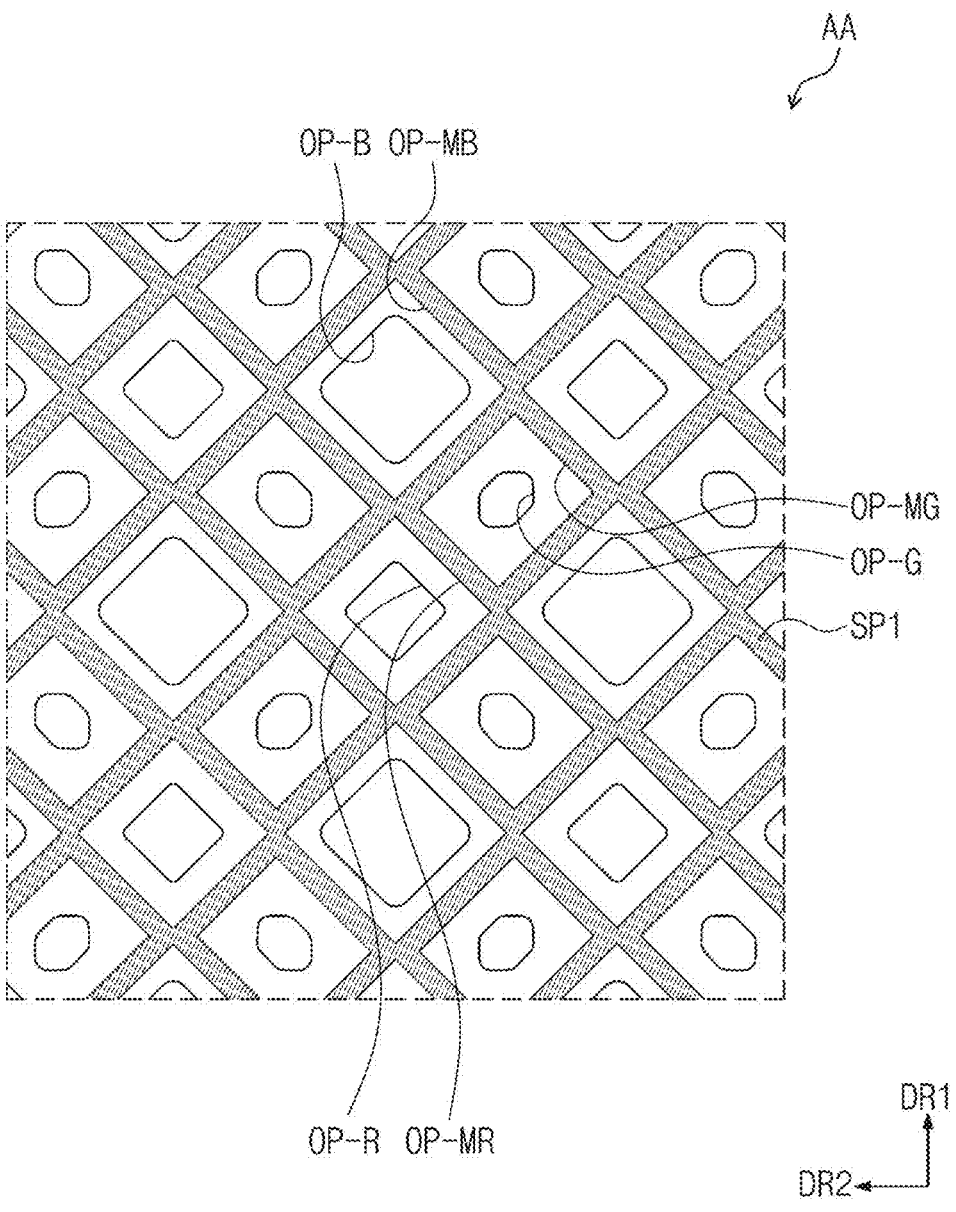
FIG. 6E is an enlarged plan view of an area AA of FIG. 6B.

FIG. 6A is a cross-sectional view of an input sensing layer ISL according to an exemplary embodiment of the inventive concept. FIG. 6B is a plan view of the input sensing layer ISL according to an exemplary embodiment of the inventive concept. FIGS. 6C and 6D are partial cross-sectional views of the input sensing layer ISL according to an exemplary embodiment of the inventive concept. FIG. 6E is an enlarged plan view of an area AA of FIG. 6B.

As illustrated in FIG. 6A, the input sensing layer ISL may include a first insulation layer IS-IL1, a first conductive layer IS-CL1, a second insulation layer IS-IL2, a second conductive layer IS-CL2, and a third insulation layer IS-IL3. The first insulation layer IS-IL1 may be directly disposed on the upper insulation layer TFL. In another exemplary embodiment of the inventive concept, the first insulation layer IS-IL1 may be omitted. Each of the first conductive layer IS-CL1 and the second conductive layer IS-CL2 may have a single-layer structure or a multi-layer structure in which a plurality of layers are stacked in the third directional axis DR3. The conductive layer having the multilayer structure may include at least two of the transparent conductive layers and the metal layers. The conductive layer having the multilayer structure may include metal layers, including metals different from each other. The transparent conductive layer may include indium tin oxide (ITO), indium zinc oxide (IZO), zinc oxide (ZnO), indium tin zinc oxide (ITZO), PEDOT, a metal nano wire, and graphene. The metal layer may be formed of molybdenum, silver, titanium, copper, aluminum, and an alloy thereof. For example, each of the first and second conductive layers IS-CL1 and IS-CL2 may have a three-layered metal structure, for example, a three-layered structure of titanium/aluminum/titanium.

Each of the first and second conductive layers IS-CL1 and IS-CL2 may include a plurality of conductive patterns. Hereinafter, an example in which the first conductive layer IS-CL1 includes first conductive patterns, and the second conducive layer IS-CL2 includes second conductive patterns will be described. Each of the first and second conductive patterns may include sensing electrodes and signal lines connected to the sensing electrodes.

Each of the first and second insulation layers IS-IL1 and IS-IL2 may include an inorganic or organic material. In this exemplary embodiment, each of the first and second insulation layers IS-IL1 and IS-IL2 may be an inorganic layer including an inorganic material. The inorganic layer may include at least one of oxide, titanium oxide, silicon oxide, silicon oxide nitride, zirconium oxide, or hafnium oxide. The third insulation layer IS-IL3 may include an organic material. The organic layer may include at least one of an acrylic-based resin, a methacrylic-based resin, a polyiso-prene-based resin, a vinyl-based resin, an epoxy-based resin, a urethane-based resin, a cellulose-based resin, a siloxane-based resin, a polyimide-based resin, a polyamide-based resin, or a perylene-based resin.

As illustrated in FIG. 6B, the input sensing layer ISL may include a sensing area IS-DA and a line area IS-NDA, which correspond to the display area DP-DA and the non-display area DP-NDA of the display panel DP. The sensing area IS-DA may be defined as an area in which a first electrode group EG1 and a second electrode group EG2 are disposed, which will be described later.

The input sensing layer ISL may include a first electrode group EG1, a second electrode group EG2, a first signal line group SG1 electrically connected to a corresponding electrode of the first electrode group EG1, a second signal line group SG2 electrically connected to the other electrode of the first electrode group EG1, and a third signal line group SG3 electrically connected to the second electrode group EG2. The first signal line group SG1, the second signal line group SG2, and the third signal line group SG3 are disposed in the line area IS-NDA.

In this exemplary embodiment, the input sensing layer ISL may be a capacitive touch sensor that senses an external input in a mutual cap manner. One of the first electrode group EG1 and the second electrode group EG2 may receive a detection signal, and the other one may output a variation in capacitance between the first electrode group EG1 and the second electrode group EG2 as a sensing signal.

The first electrode group EG1 includes a plurality of first sensing electrodes (or electrodes). The first electrode group EG1 includes 1th to i-th (where i is a natural number of 2 or more) electrode. The first electrode group EG1 including the ten electrodes IE1-1 to 1E-1-10 are illustrated as an example. The 1-th to 10-th electrodes IE1-1 to IE1-10 may extend in the second direction DR2. The 1-th to 10-th electrodes IE1-1 to IE1-10 are arranged in a direction that is away from the pad areas IS-PA1, IS-PA2, and IS-PA3 in the first direction DR1.

The second electrode group EG2 includes a plurality of second sensing electrodes (or electrodes). The second electrode group EG2 includes 1-th to j-th (where j is a natural number of 2 or more) electrode. The second electrode group EG2 including the eight electrodes IE2-1 to 1E-2-8 are illustrated as an example. The 1-th to 8-th electrode IE2-1 to IE2-8 cross the 1-th to 10-th electrodes IE1-1 to IE1-10. The 1-th to 8-th electrodes IE2-1 to IE2-8 may extend in the first direction DR1.

The first signal line group SG1 includes a plurality of first signal lines (or signal lines). The first signal line group SG1 includes 1-th to k-th (where k is the largest natural number of the natural numbers equal to or less than i/2) signal lines. In this exemplary embodiment, the first signal line group SG1 includes five signal lines.

The 1-th to k-th signal lines may be sequentially connected to odd-numbered electrodes or even-numbered electrodes of the 1-th to i-th (where i is a natural number of 2 or more) electrodes. In this exemplary embodiment, five signal lines of the first signal line group SG1 are respectively connected to even-numbered electrode of ten electrodes IE1-1 to IE1-10. The five signal lines of the first signal line group SG1 are respectively connected to right ends of the even-numbered electrodes.

The second signal line group SG2 includes a plurality of second signal lines (or signal lines). The second signal line group SG2 includes 1-th to k-th (where k is the largest natural number of the natural numbers equal to or less than i/2) signal lines. In this exemplary embodiment, the second signal line group SG2 includes five signal lines. In this exemplary embodiment, five signal lines of the second signal line group SG2 are respectively connected to odd-numbered electrode of ten electrodes IE1-1 to IE1-10. The five signal lines of the second signal line group SG2 are respectively connected to left ends of the odd-numbered electrodes.

The third signal line group SG3 is respectively connected to 1-th to j-th electrodes of the second electrode group EG2. The 1-th to 8-th signal lines of the third signal line group SG3 respectively connected to lower ends of the 1-th to 8-th electrodes IE2-1 to IE2-8 are illustrated as an example.

A portion of the signal lines of the first signal line group SG1 may be disposed in the first pad area IS-PA1, a portion of the signal lines of the second signal line group SG2 may be disposed in the second pad area IS-PA2, and a portion of the signal lines of the third signal line group SG3 is disposed in the third pad area IS-PA3.

Each of the electrodes of the first electrode group EG1 includes a plurality of first sensing parts SP1 and a plurality of first connection parts CP1. The first sensing parts SP1 are arranged in the second direction DR2. Each of the first connection parts CP1 connects two first sensing parts SP1, which are adjacent to each other in the second direction DR2, of the first sensing parts SP1.

Each of the electrodes of the second electrode group EG2 includes a plurality of second sensing parts SP2 and a plurality of second connection parts CP2. The second sensing parts SP2 are arranged in the first direction DR1. Each of the second connection parts CP2 connects two second sensing parts SP2, which are adjacent to each other in the first direction DR1, of the second sensing parts SP2.

The electrodes of the first electrode group EG1 and the second electrode group EG2 are insulated from each other. FIG. 6B illustrates an example in which the first connection part CP1 and the second connection part CP2 cross each other. Portions of the plurality of first sensing parts SP1, the plurality of first connection parts CP1, the plurality of second sensing parts SP2, and the plurality of second connection parts CP2 may be formed by patterning the first conductive layer IS-CL1 of FIG. 6A, and other portions may be formed by patterning the second conductive layer IS-CL2 of FIG. 6A.

As illustrated in FIG. 6C, the plurality of first connection parts CP1 may be formed from the first conductive layer IS-CL1, and the plurality of first sensing parts SP1, the plurality of second sensing parts SP2, and the plurality of second connection parts CP2 may be formed from the second conductive layer IS-CL2. The first sensing parts SP1 and the first connection parts CP1 may be connected to each other through contact holes CNT-I passing through the second insulation layer IS-IL2.

In this exemplary embodiment, although the plurality of first connection parts CP1 and the plurality of second connection parts CP2 cross each other, the inventive concept is not limited thereto. For example, each of the first connection parts CP1 may be deformed into a "Λ"-shaped curved line and/or a "V"-shaped curved line so that the first connection parts CP1 do not overlap the second connection parts CP2. The first connection parts CP1 having the "Λ"-shaped curved line and/or a "V"-shaped curved line may overlap the second sensing part SP2 on a plane.

The first signal line group SG1, the second signal line group SG2, and the third signal line group SG3 may be formed from the second conductive layer IS-CL2 (see FIG. 6A). Two signal lines SG1-4 and SG1-5 of the first signal line group SG1 formed from the second conductive layer IS-CL2 are illustrated in FIG. 6D.

The plurality of first sensing parts SP1 and the plurality of second sensing parts SP2 may have a mesh shape. FIG. 6E illustrates an example of the first sensing part SP1 having the mesh shape.

Three types of openings OP-MG, OP-MR, and OP-MB are defined in the first sensing parts SP1. The three types of openings OP-MG, OP-MR, and OP-MB may correspond to three types of light emitting opening OP-G, OP-R, and OP-B of the pixel defining layer PDL (see FIG. 5A). The three types of light emitting opening OP-G, OP-R, and OP-B may be defined in the same manner as the light emitting opening OP of FIG. 5A. Although not shown, like the light emitting opening OP and the emission area PXA described with reference to FIG. 5A, three types of emission areas corresponding to the three types of light emitting opening OP-G, OP-R, and OP-B may be set.

The three types of light emitting opening OP-G, OP-R, and OP-B may be classified according to a surface area thereof. A surface area of each of the first type opening OP-G, the second type opening OP-R, and the third type opening OP-B is proportional to an emission surface area of the corresponding pixel.

The plurality of pixels PX described with reference to FIG. 4 may include a green pixel generating green light, a red pixel generating red light, and a blue pixel generating blue light. In this exemplary embodiment, the first type opening OP-G, the second type opening OP-R, and the third type opening OP-B may respectively correspond to the green pixel, the red pixel, and the blue pixel.

The three types of openings OP-MG, OP-MR, and OP-MB may include a first opening OP-MG, a second opening OP-MR, and a third opening OP-MB, which respectively correspond to the first type opening OP-G, the second type opening OP-R, and the third type opening OP-B.

In this exemplary embodiment, although the first opening OP-MG, the second opening OP-MR, and the third opening OP-MB one-to-one correspond to the first type opening OP-G, the second type opening OP-R, and the third type opening OP-B, the inventive concept is not limited thereto. Each of the opening OP-MG, OP-MR, and OP-MB may correspond to two or more openings OP-G, OP-R, and OP-B.

Figure 7A:
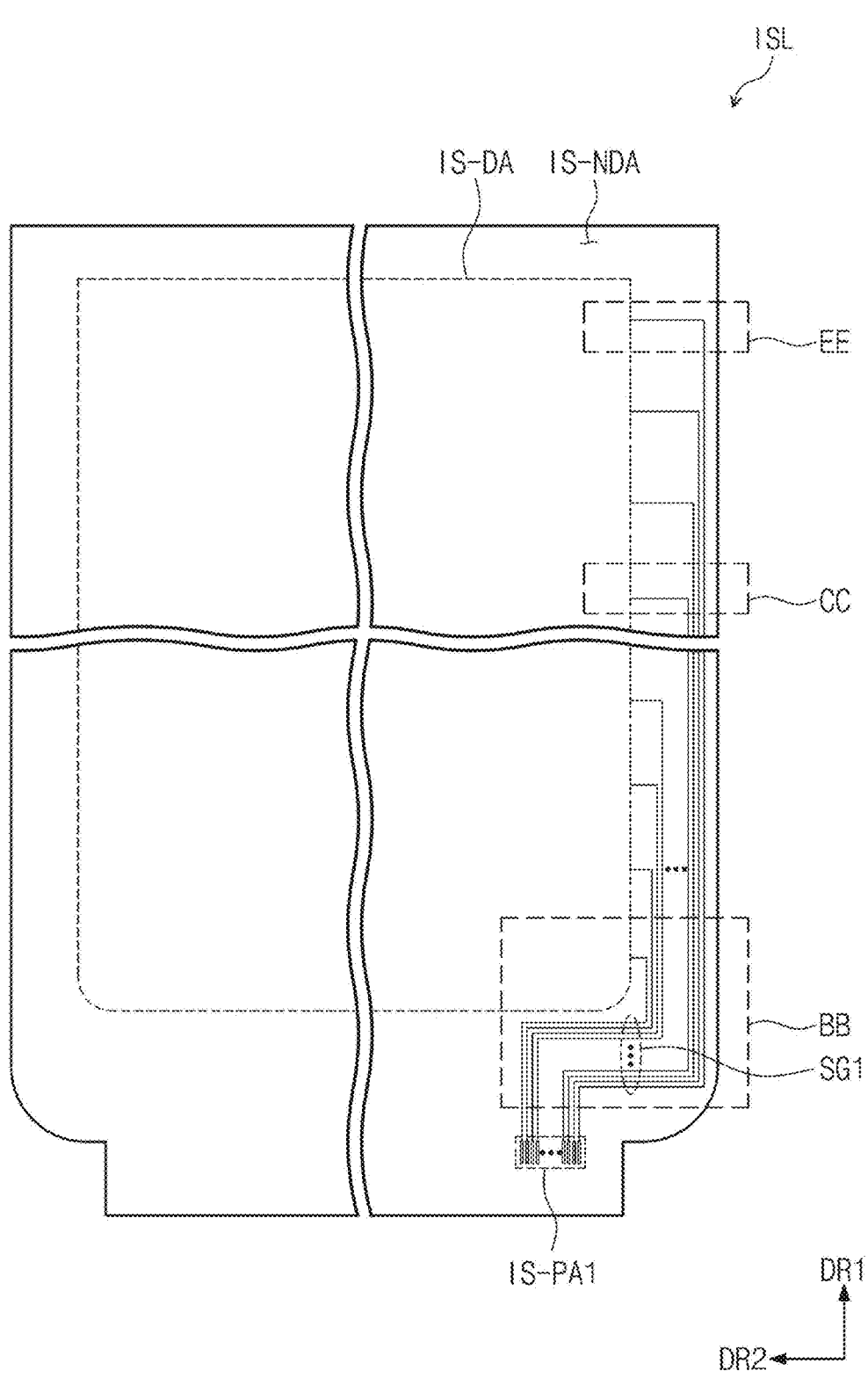
FIG. 7A is a plan view of an input sensing layer according to an exemplary embodiment of the inventive concept.
Figure 7B:
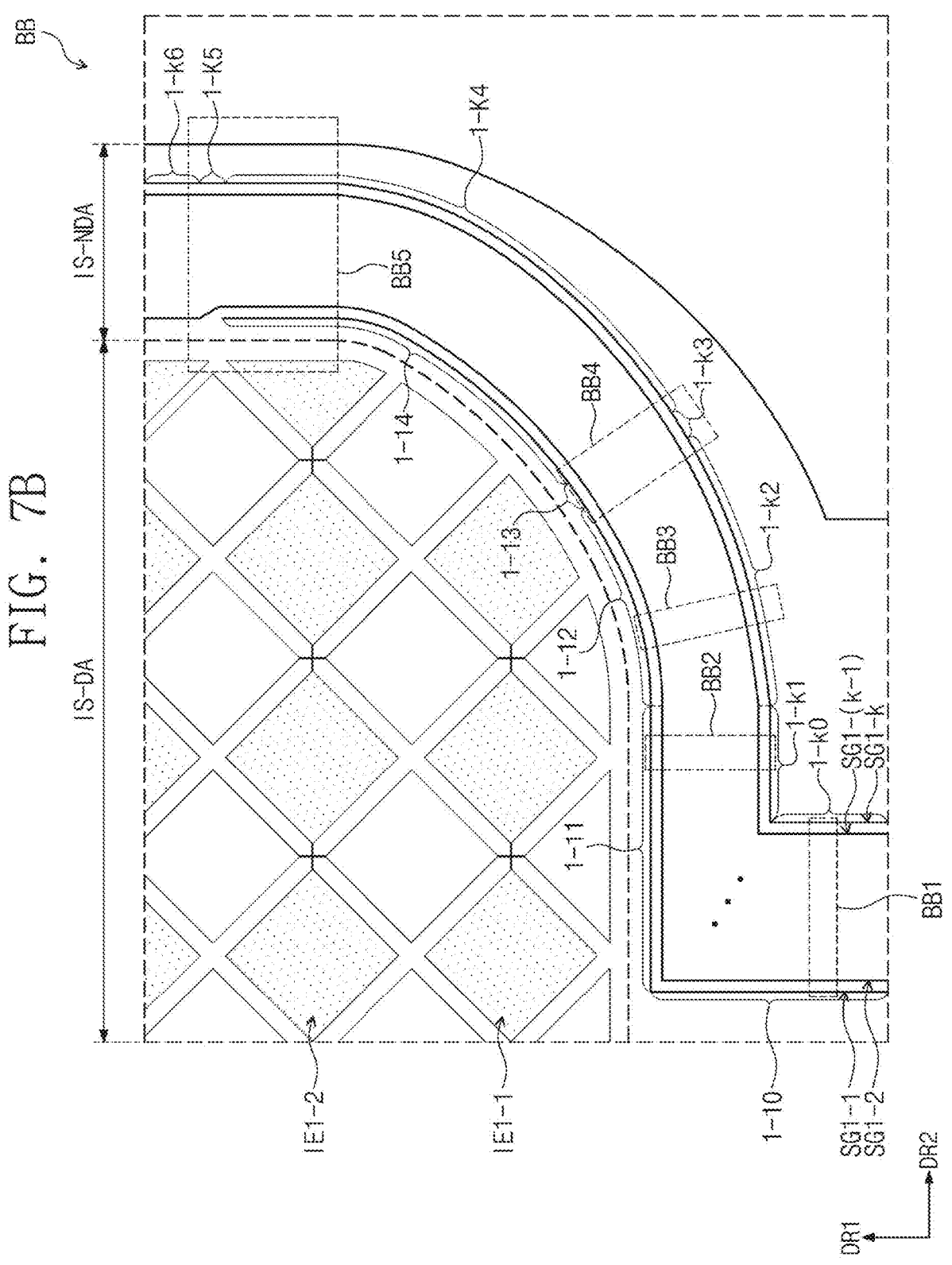
FIG. 7B is an enlarged plan view of an area BB of FIG. 7A.
Figure 7C:
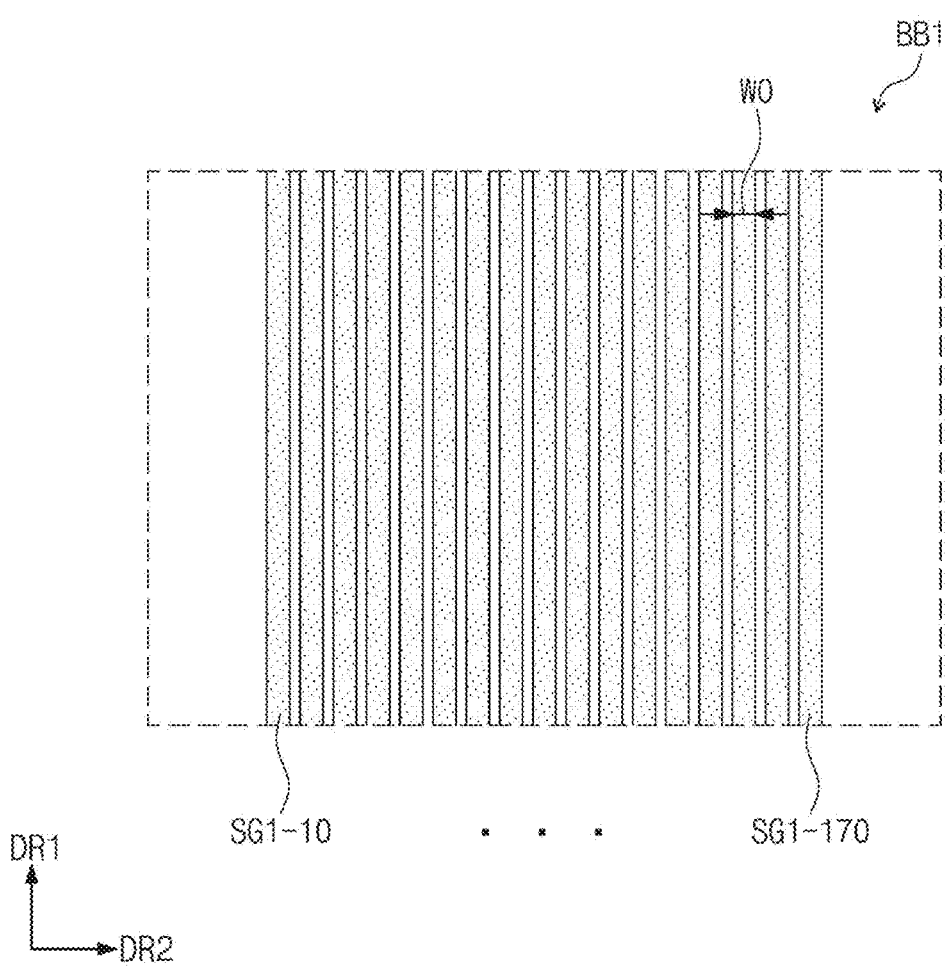
FIG. 7C is an enlarged plan view illustrating a pad portion of a signal line of FIG. 7B.

FIG. 7A is a plan view of an input sensing layer ISL according to an exemplary embodiment of the inventive concept. FIG. 7B is an enlarged plan view of an area BB of FIG. 7A. FIG. 7C is an enlarged plan view illustrating a pad portion of a signal line of FIG. 7B. FIGS. 7D to 7G are enlarged plan views illustrating an area BB1 to an area BB5 of the signal line of FIG. 7B. FIG. 7H is an enlarged plan view of an area CC of FIG. 7A. FIG. 7I is an enlarged plan view of an area EE of FIG. 7A. FIG. 7J is a graph illustrating results obtained by comparing resistance distribution of the line of the input sensing layer (an input sensor) according to an exemplary embodiment of the inventive concept with resistance distribution of a line of an input sensor according to a comparative example.

FIG. 7A schematically illustrates a relationship between a sensing area IS-DA and a line area IS-NDA. The first signal line group SG1 disposed in the line area IS-NDA are schematically illustrated. Referring to FIG. 7A, the sensing area IS-DA may have a substantially rectangular shape. The sensing area IS-DA may include a boundary of a curved line defined by corner areas.

FIG. 7B illustrates the first signal line group SG1 including 1-th to k-th signal lines SG1-1 to SG1-k. Each of the 1-th to k-th signal lines SG1-1 to SG1-k may include a plurality of portions that are distinguished from each other. In this exemplary embodiment, k may be a number 17.

The 1-th to k-th signal lines SG1-1 to SG1-*k* may have lengths different from each other. The 1-th to k-th signal lines SG1-1 to SG1-*k* may include a plurality of portions different from each other. The 1-th signal line SG1-1 includes five portions 1-10 to 1-14, which are distinguished from each other. The k-th signal line SG1-*k* includes seven portions **1-*k*0 to 1-*k*6**, which are distinguished from each other. FIG. 7B illustrates only a portion of the k-th signal line SG1-*k*, i.e., seven portions **1-*k*0 to 1-*k*6**.

As illustrated in FIGS. 7B and 7C, each of the 1-th to k-th signal lines SG1-1 to SG1-*k* may include pad portions SG1-10 to SG1-*k*0. In FIG. 7C, k is a number 17. Each of the pad portions SG1-10 to SG1-*k*0 extends in the first direction DR1 and partially overlaps the pad area IS-PA1 (see FIG. 7A). The pad portions SG1-10 to SG1-*k*0 of the 1-th to k-th signal lines SG1-1 to SG1-*k* extend from first portions SG1-11 to SG1-*k*1 of each of the 1-th to k-th signal lines SG1-1 to SG1-*k*.

The pad portions SG1-10 to SG1-*k*0 of the 1-th to k-th signal lines SG1-1 to SG1-*k* may have the same width W0 (or a line width). The pad portions SG1-10 to SG1-*k*0 of the 1-th to k-th signal lines SG1-1 to SG1-*k* may have lengths different from each other in the first direction DR1. The 1-th to k-th signal lines SG1-1 to SG1-*k* may have lengths that gradually increase from the 1-th signal line SG1-1 to the k-th signal line SG1-*k*. In an exemplary embodiment of the inventive concept, the pad portions SG1-10 to SG1-*k*0 may not satisfy the above-described conditions.

Each of the 1-th to k-th signal lines SG1-1 to SG1-*k* may include at least first to fourth portions. Portions corresponding to the 1-th to k-th signal lines SG1-1 to SG1-*k* may satisfy conditions to be described below.

Figure 7D:
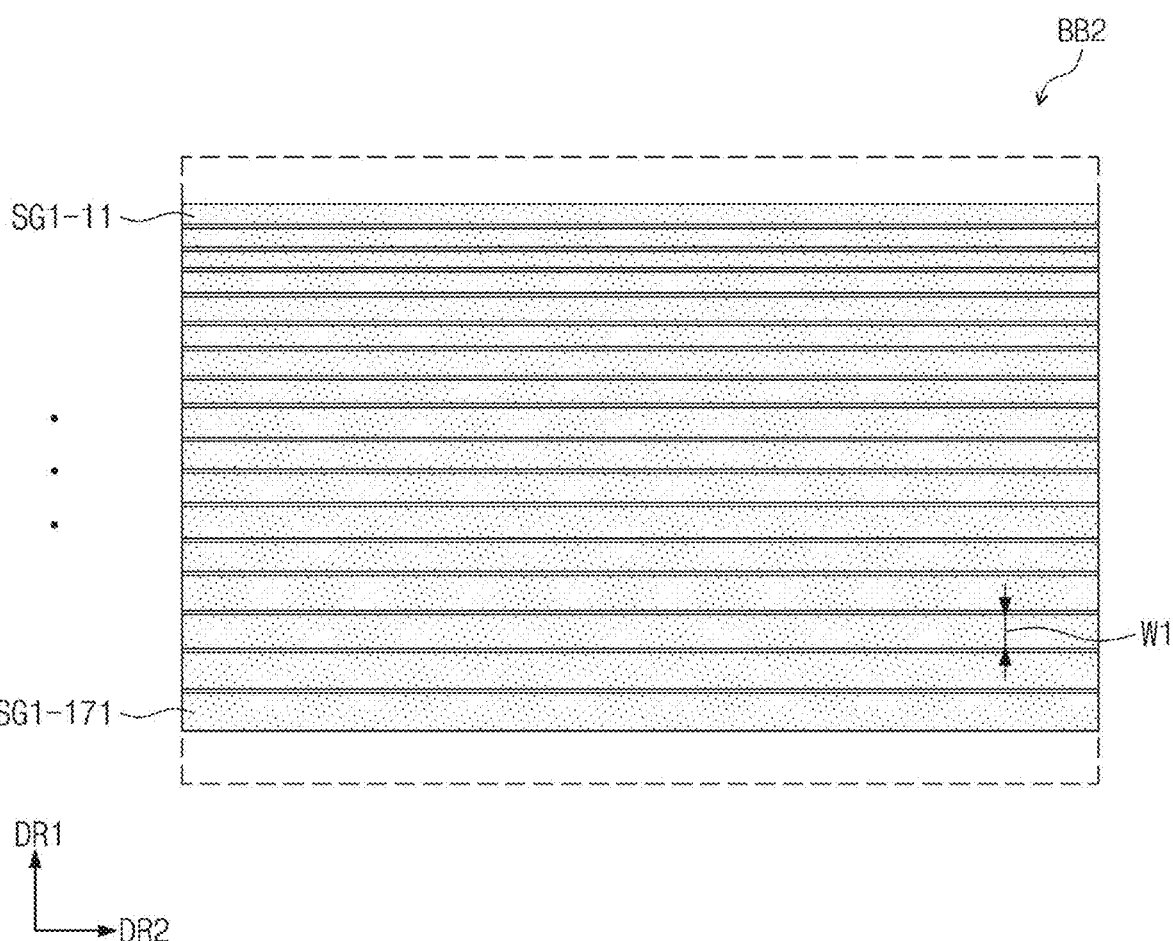
FIGS. 7D, 7E, 7F, and 7G are enlarged plan views illustrating an area BB1 to an area BB5 of the signal line of FIG. 7B.

As illustrated in FIGS. 7B and 7D, the first portions SG1-11 to SG1-*k*1 of the 1-th to k-th signal lines SG1-1 to SG1-*k* extend in the second direction DR2. In FIG. 7D, k is a number 17. The first portions SG1-11 to SG1-*k*1 of the 1-th to k-th signal lines SG1-1 to SG1-*k* may have a constant width W1. The first portions SG1-11 to SG1-*k*1 of the 1-th to k-th signal lines SG1-1 to SG1-*k* may have widths that gradually increase from the 1-th signal line SG1-1 to the k-th signal line SG1-*k*.

In FIG. 7B, ends of the first portions SG1-11 to SG1-*k*1 of the 1-th to k-th signal lines SG1-1 to SG1-*k* or boundary points between the first portions SG1-11 to SG1-*k*1 and the second portions SG1-12 to SG1-*k*2 of the 1-th to k-th signal lines SG1-1 to SG1-*k* are aligned in the first direction DR1, but is not limited thereto. The ends of the first portions SG1-11 to SG1-*k*1 of the 1-th to k-th signal lines SG1-1 to SG1-*k* or boundary points between the first portions SG1-11 to SG1-*k*1 and the second portions SG1-12 to SG1-*k*2 of the 1-th to k-th signal lines SG1-1 to SG1-*k* are aligned in a direction crossing the first direction DR1 and the second direction DR2.

Figure 7E:
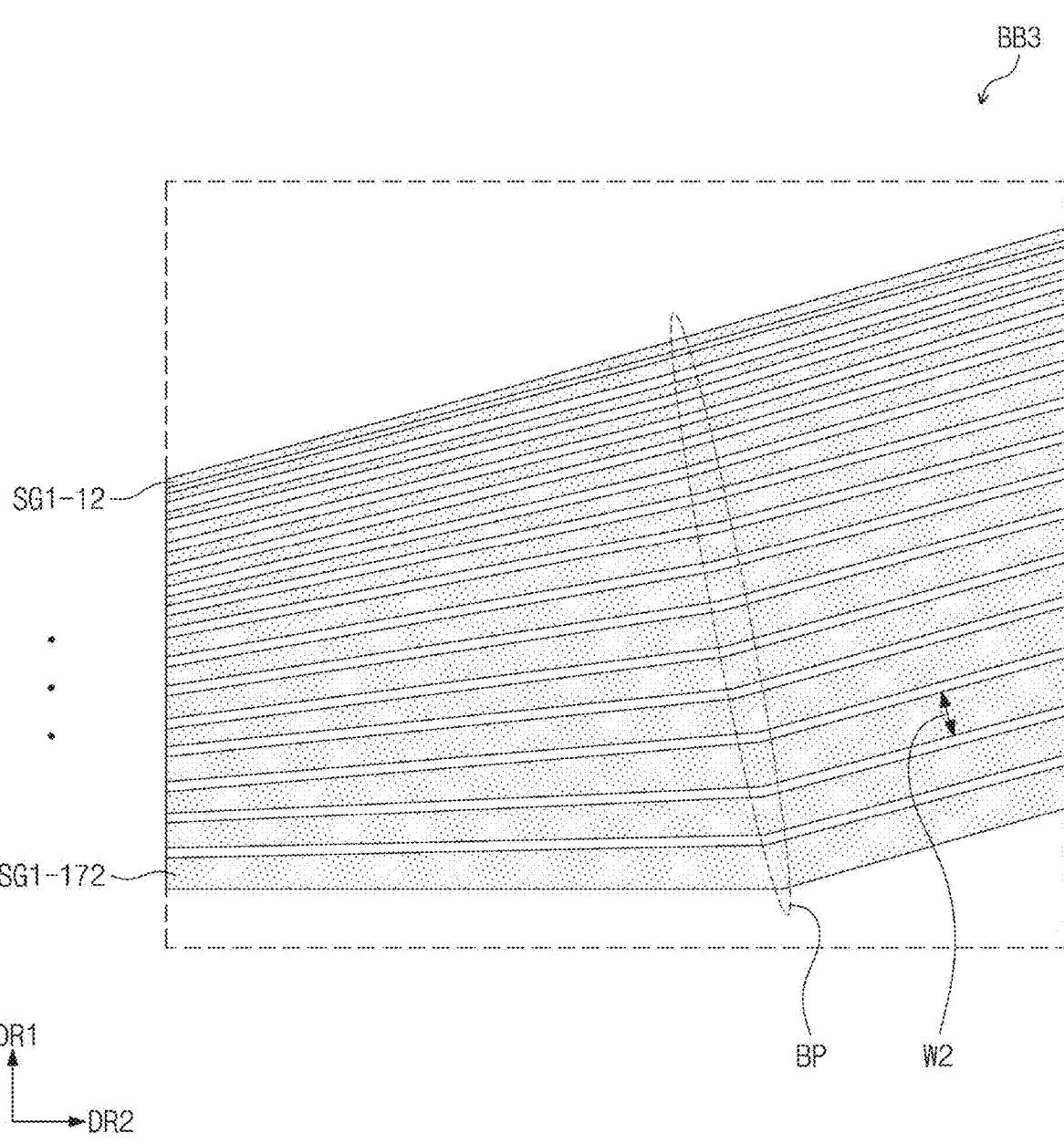

As illustrated in FIGS. 7B and 7E, the second portions SG1-12 to SG1-*k*2 of the 1-th to k-th signal lines SG1-1 to SG1-*k* have widths W2 gradually increasing in a direction that is away from the first portions SG1-11 to SG1-*k*1. In FIG. 7D, k is a number 17.

In this exemplary embodiment, a portion of the second portions SG1-12 to SG1-*k*2 of the 1-th to k-th signal lines SG1-1 to SG1-*k* may have a curved shape or at least one inflection point BP at which the extension direction is changed. Referring to FIG. 7E, the extension direction of each of the 1-th to k-th signal lines SG1-1 to SG1-*k* may be changed in a direction that is more inclined with respect to the second direction DR2 on the basis of the inflection point BP.

The second portions SG1-12 to SG1-*k*2 of the 1-th to k-th signal lines SG1-1 to SG1-*k* are disposed outside a corner area of the sensing area IS-DA.

The 1-th to k-th signal lines SG1-1 to SG1-*k* may be divided into a portion extending in the second direction DR2 and a portion extending in the first direction DR1 with respect to the corner area. The second portions SG1-12 to SG1-*k*2 may be inflection areas of the portion extending in the second direction DR2 and the portion extending in the first direction DR1. In this exemplary embodiment, third portions SG1-13 to SG1-*k*3 and fourth portions SG1-14 to SG1-*k*4 of the 1-th to k-th signal lines SG1-1 to SG1-*k* may also be disposed outside the corner area and correspond to inflection areas of the 1-th to k-th signal lines SG1-1 to SG1-*k*.

Figure 7F:
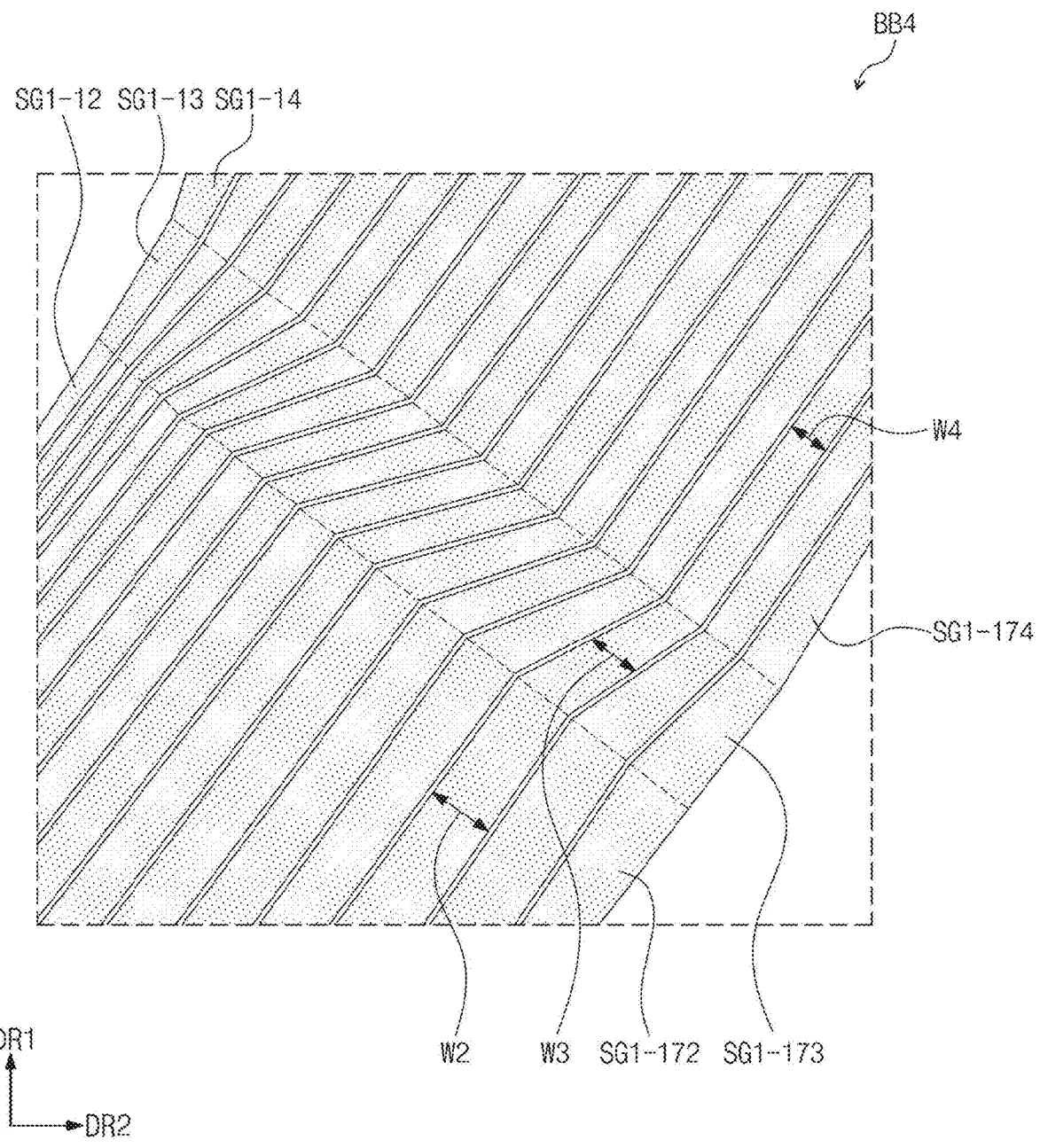

As illustrated in FIGS. 7B and 7F, the third portions SG1-13 to SG1-*k*3 of the 1-th to k-th signal lines SG1-1 to SG1-*k* have widths W3 gradually increasing in a direction that is away from the second portions SG1-12 to SG1-*k*2. In FIG. 7F, k is a number 17.

Figure 7G:
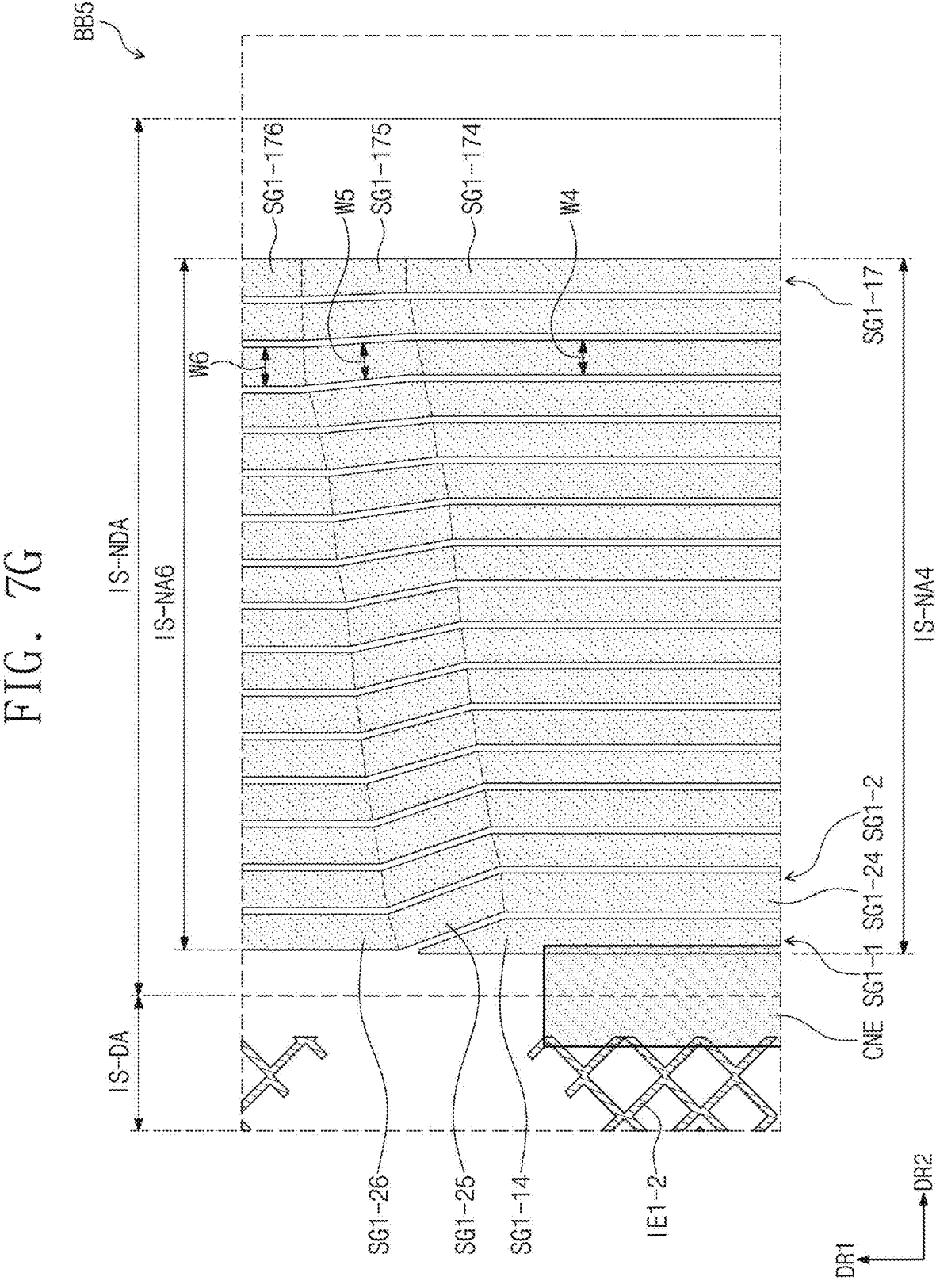
Figure 7H:
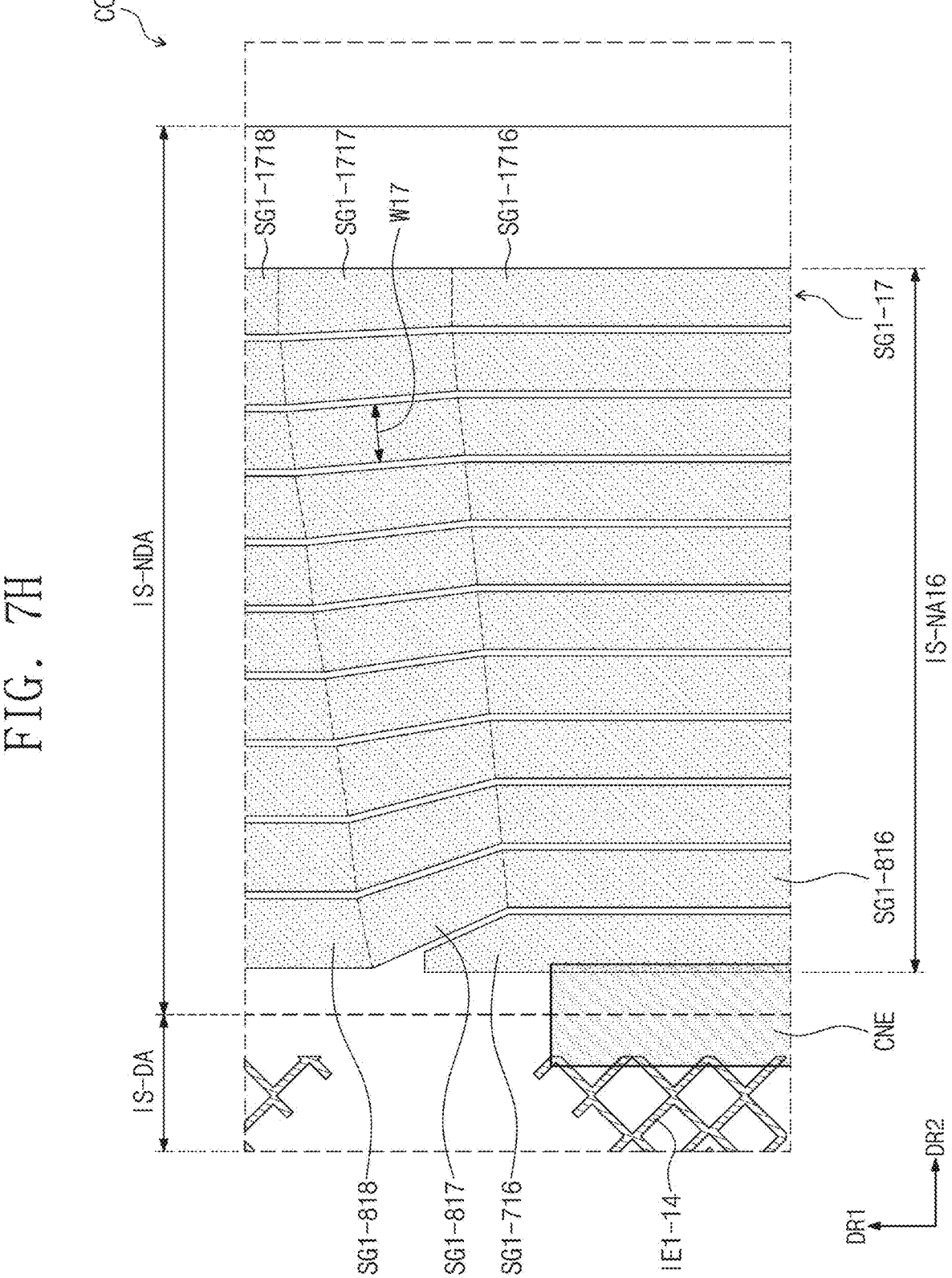
FIG. 7H is an enlarged plan view of an area CC of FIG. 7A.
Figure 7I:
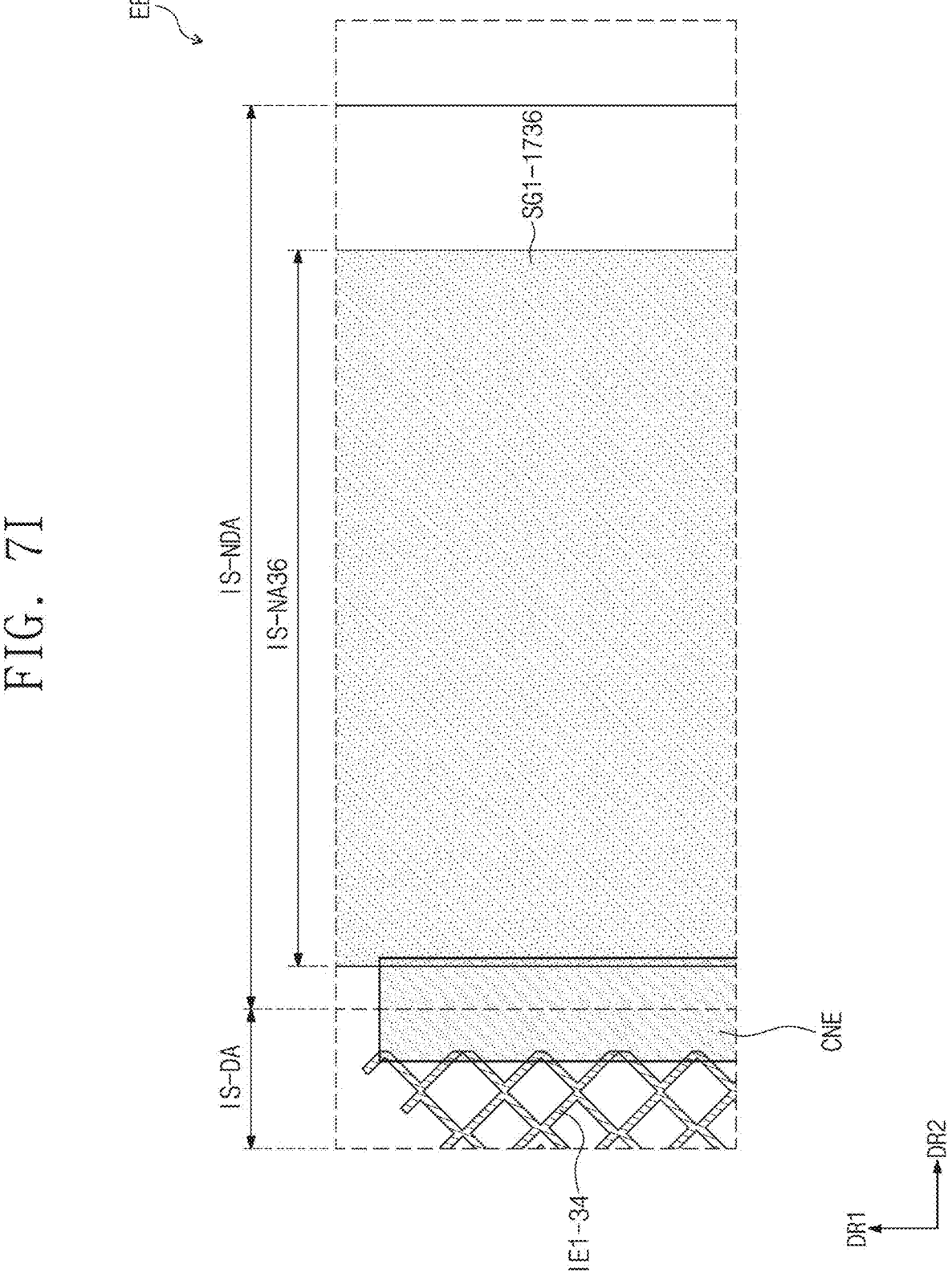
FIG. 7I is an enlarged plan view of an area EE of FIG. 7A.
Figure 7J:
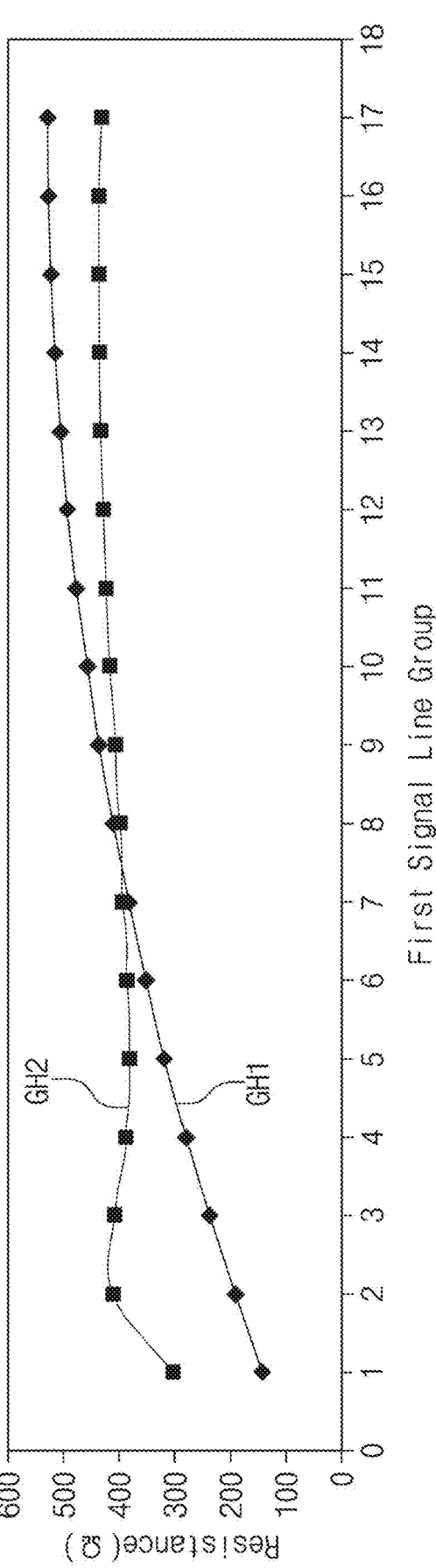
FIG. 7J is a graph illustrating results obtained by comparing resistance distribution of the line of the input sensing layer according to an exemplary embodiment of the inventive concept with resistance distribution of a line of an input sensing layer according to a comparative example.

As illustrated in FIGS. 7B and 7G, each of fourth portions SG1-14 to SG1-*k*4 of the 1-th to k-th signal lines SG1-1 to SG1-*k* have a constant width W4. The fourth portions SG1-14 to SG1-*k*4 of the 1-th to k-th signal lines SG1-1 to SG1-*k* may have the same width W4. At least a portion of the fourth portions SG1-14 to SG1-*k*4 of the 1-th to k-th signal lines SG1-1 to SG1-*k* extends in the first direction DR1.

Referring to FIGS. 7B and 7F, the third portions SG1-13 to SG1-*k*3 may correspond to inflection portions for converting the 1-th to k-th signal lines SG1-1 to SG1-*k* from the width W2 of the second portions SG1-12 to SG1-*k*2 to the width W4 of the fourth portions SG1-14 to SG1-*k*4. In this exemplary embodiment, third portions SG1-13 to SG1-73 of the 1-th to 7-th signal lines SG1-1 to SG1-7 may have a width W3 gradually increasing in a direction that is close to fourth portions SG1-14 to SG1-74, and third portions SG1-83 to SG1-173 of the 8-th to 17-th signal lines SG1-8 to SG1-17 may have a width W3 gradually decreasing in a direction that is close to fourth portions SG1-84 to SG1-174. The third portions SG1-13 to SG1-73 of portions of the signal lines may have a width W3 that linearly increases, and the third portions SG1-83 to SG1-173 of other portions of the signal lines may have a width W3 that linearly decreases.

As illustrated in FIGS. 7B and 7G, a fourth portion SG1-14 of the 1-th signal line SG1-1 and the 2-th electrode IE1-2 of the first electrode group EG1 may be connected to each other through the connection electrode CNE. Although not separately shown, the last portions of other signal lines SG1-2 to SG1-17 may also be connected to the corresponding electrode of the first electrode group EG1 through the connection electrode CNE.

As illustrated in FIGS. 7B and 7G, the connection electrode CNE is disposed on a fourth portion SG1-14 of the 1-th signal line SG1-1 and the 2-th electrode IE1-2 of the first electrode group EG1. The connection electrode CNE is formed after the patterning process. The connection electrode CNE may include indium tin oxide (ITO), indium zinc oxide (IZO), zinc oxide (ZnO), indium tin zinc oxide (ITZO), PEDOT, a metal nano wire, and graphene.

In this exemplary embodiment, 2-th to k-th signal lines SG1-2 to SG1-*k* may include fifth portions SG1-25 to SG1-*k*5 extending from fourth portions SG1-24 to SG1-*k*4 and sixth portions SG1-26 to SG1-*k*6 extending from the fifth portion SG1-25 to SG1-*k*5. In this exemplary embodiment, k is a number 17.

Referring to FIGS. 7B and 7G, the fifth portions SG1-25 to SG1-175 may correspond to inflection portions for converting the 2-th to 17-th signal lines SG1-2 to SG1-17 from the width W4 of the fourth portions SG1-24 to SG1-174 to the width W6 of the sixth portions SG1-26 to SG1-176. In this exemplary embodiment, fifth portions SG1-25 to SG1-175 of the 2-th to 17-th signal lines SG1-2 to SG1-17 may have a width W5 gradually increasing in a direction that is away from the fourth portions SG1-24 to SG1-174.

A width of an area IS-NA4 in which the fourth portions SG1-14 to SG1-174 are disposed and a width of an area IS-NA6 in which the sixth portions SG1-26 to SG1-176 are disposed in the second direction DR2 may be substantially the same. The sixth portions SG1-26 to SG1-176 may have the same width. The sixth portions SG1-26 to SG1-176 may have a constant width W6. The sixth portions SG1-26 to SG1-176 may have a width W6 greater than that W4 of the fourth portions SG1-14 to SG1-174. A fewer number of signal lines are arranged in the same area, and thus, the signal lines may increase in width.

Referring to FIGS. 7A, 7G, and 7H, the number of 1-th to k-th signal lines SG1-1 to SG1-*k*, which are disposed in the same area, may gradually decrease as extending in the first direction DR1. In this exemplary embodiment, k may be a number 17.

As illustrated in FIG. 7H, sixteenth portions SG1-716 to SG1-1716 of 7-th to 17-th signal lines SG1-7 to SG1-17 are disposed in an area adjacent to the fourteenth electrode IE1-14 of the first electrode group EG1. The 7-th signal line SG1-7 is connected to the fourteenth electrode IE1-14 of the first electrode group EG1 through the connection electrode CNE.

A width of an area IS-NA16 in which the sixteenth portions SG1-716 to SG1-1716 of the 7-th to 17-th signal lines SG1-7 to SG1-17 are disposed and a width of an area IS-NA4 in which the fourth portions SG1-14 to SG1-174 of FIG. 7G are disposed in the second direction DR2 may be substantially the same.

FIG. 7I illustrates the last portion of the k-th signal line SG1-*k* that is farthest away from the fourth portion SG1-*k*4 of the plurality of portions of the k-th signal line SG1-*k*. In this exemplary embodiment, k may be a number 17.

According to this exemplary embodiment, the last portion SG1-1736 of the 17-th signal line SG1-17 is disposed to correspond to 34-th electrode IE1-34 that is the last electrode of the first electrode group EG1. The 17-th signal line SG1-17 is connected to the 34-th electrode IE1-34 of the first electrode group EG1 through the connection electrode CNE. A width of an area IS-NA36 in which the last portion SG1-1736 of the 17-th signal line SG1-17 is disposed in the second direction DR2 and a width of an area IS-NA4 in which the fourth portions SG1-14 to SG1-174 of FIG. 7G are disposed in the second direction DR2 may be substantially the same.

In this exemplary embodiment, the k-th signal line SG1-*k* is connected to a (2×k)-th electrode of the first electrode group EG1. The k-th signal line SG1-*k* includes a plurality of portions. Here, (4+2 (k−1))-th portion is connected to a corresponding electrode of the first electrode group EG1.

Referring to FIG. 7J, a first graph GH1 and a second graph GH2 represent resistance values of the signal lines of the first signal line group SG1. The first graph GH1 represents a variation in resistance of the signal lines according to a comparative example in which the line width is uniform.

The second graph GH2 represents resistance values of the signal lines including the first to fourth portions as described with reference to FIGS. 7A to 7I. According to this exemplary embodiment, when compared with the comparative example, the signal line having the maximum resistance may decrease in resistance value. Also, a deviation between the resistance value of the signal lines with lower order and the resistance value of the signal lines with high order may be reduced. Since the deviation between the resistance values of the signal lines of the first signal line group SG1 is reduced, sensing sensitivity may be improved. When the sensing signals are transmitted to the sensing circuit of the input sensor (the input sensing layer), noise due to the deviation between the resistance values of the signal lines with respect to the sensing signals may be minimized.

Although not separately shown, the second signal line group SG2 (see FIG. 6B) may include 1-th to k-th signal lines. The 1-th to k-th signal lines of the second signal line group SG2 may be electrically connected to odd-numbered electrodes of the first electrode group EG1. At least a portion of the signal lines of the second signal line group SG2 may include the first to fourth portions like the 1-th to k-th signal lines of the first signal line group SG1. The 2-th to k-th signal lines of the second signal line group SG2 may include the first to sixth portions.

The k-th signal line SG2-*k* of the second signal line group SG2 is connected to a ((2×k)-1)-th electrode of the first electrode group EG1. The k-th signal line SG2-*k* includes a plurality of portions. Here, a (4+2 (k−1))-th portion is connected to a corresponding electrode of the first electrode group EG1. The k-th signal line SG2-*k* may further include a pad portion.

Figure 8:
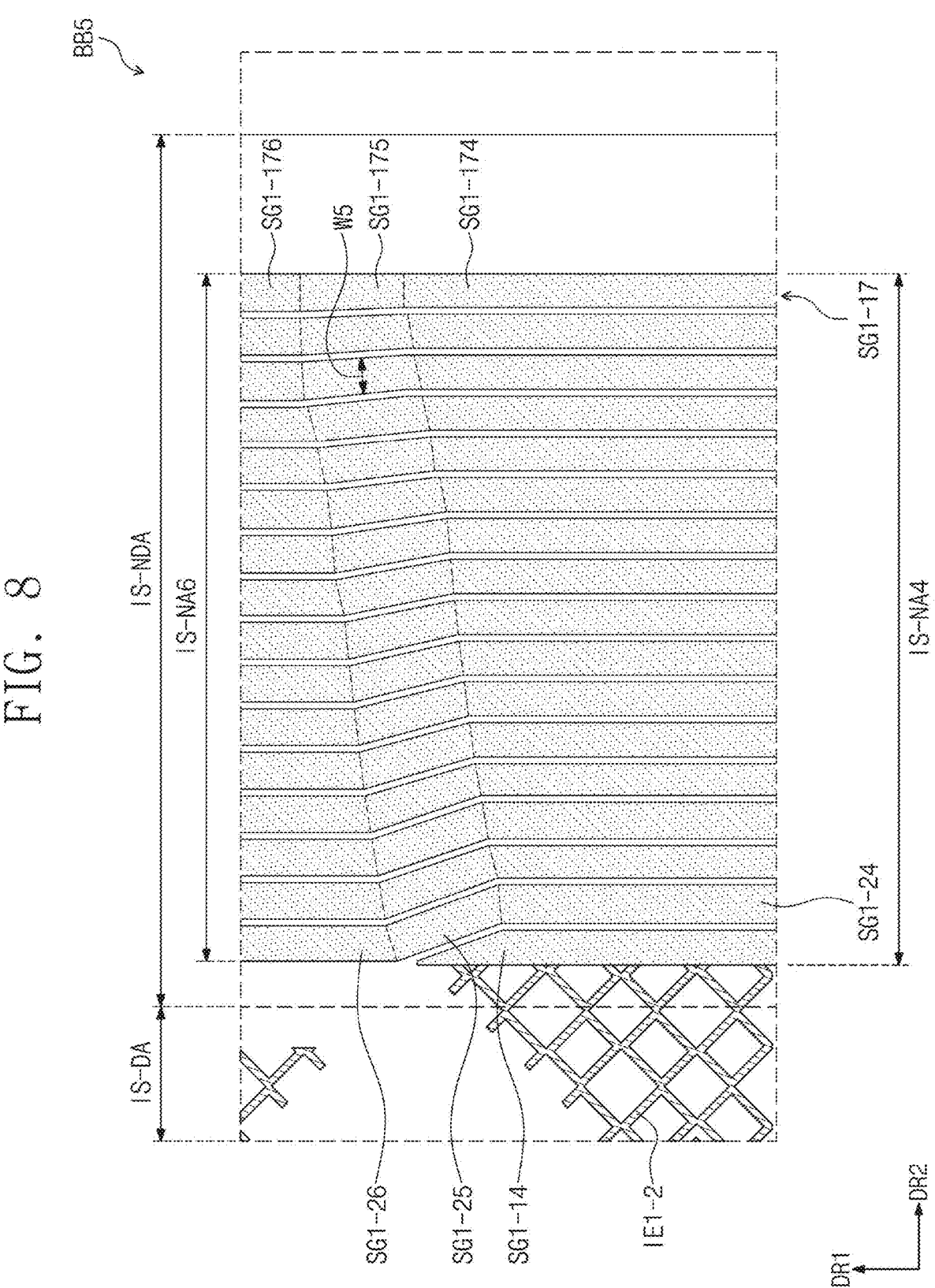
FIG. 8 is a partial plan view of an input sensing layer according to an exemplary embodiment of the inventive concept.
Figure 9A:
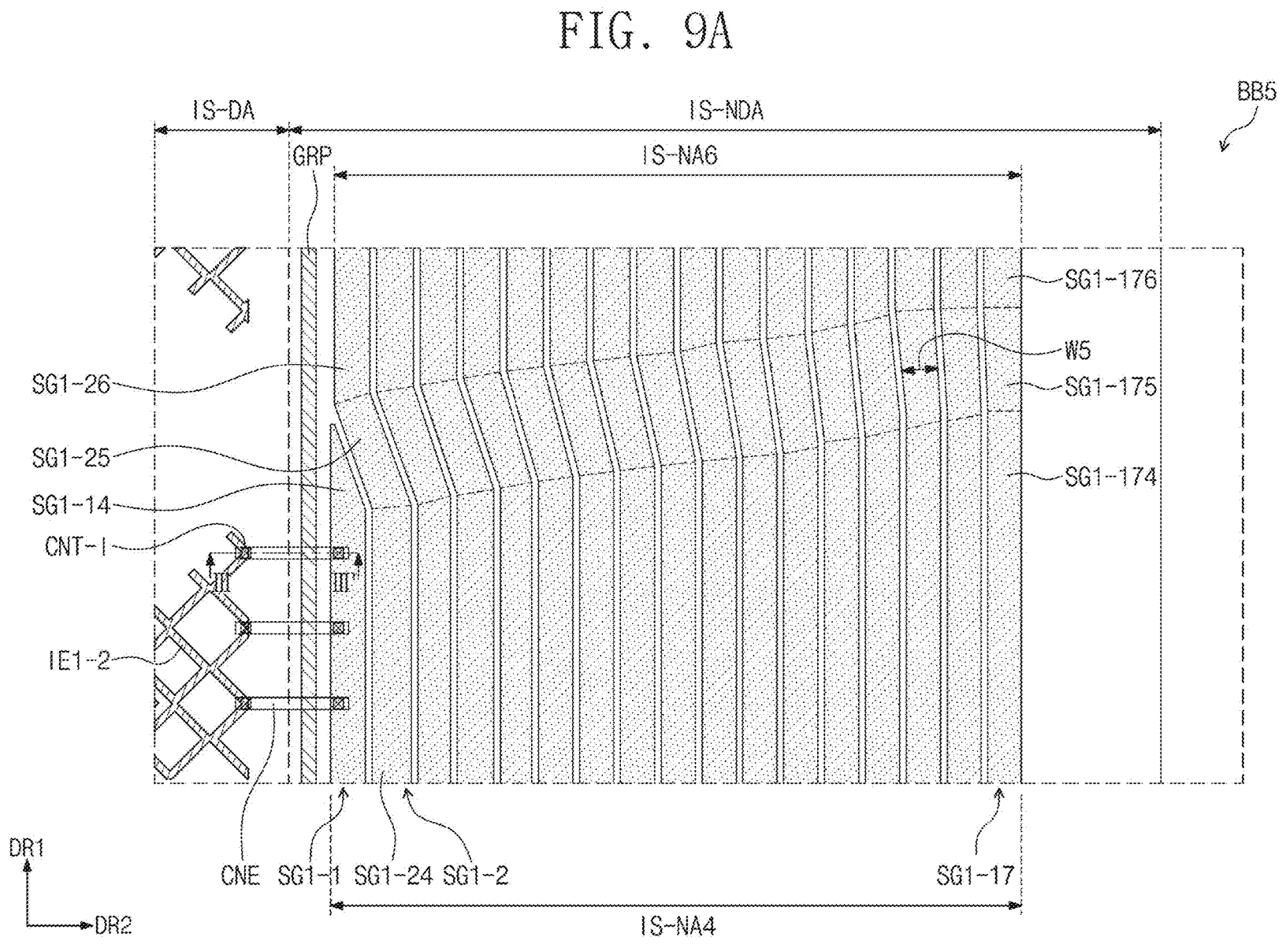
Figure 9B:
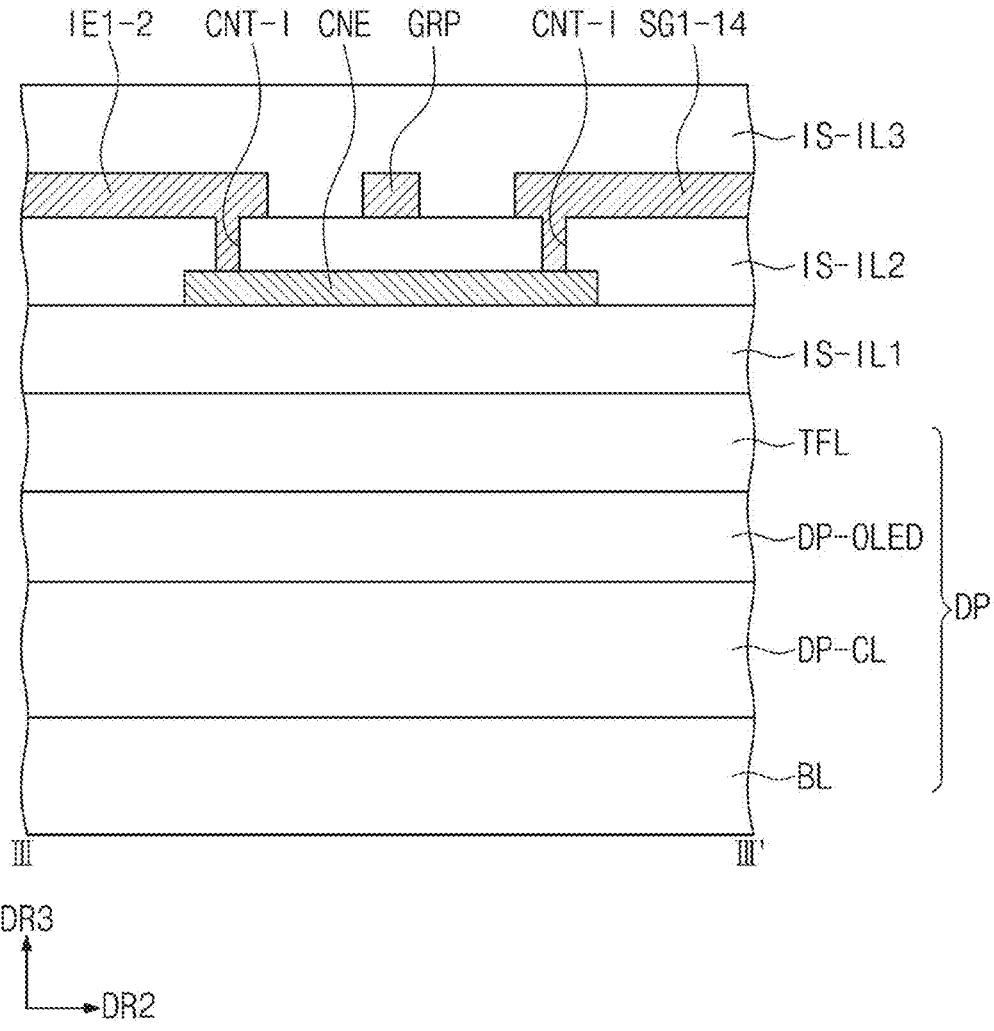
FIG. 9B is a partial plan view of the input sensing layer according to an exemplary embodiment of the inventive concept.

FIG. 8 is a partial plan view of an input sensing layer ISL according to an exemplary embodiment of the inventive concept. FIG. 9A is a partial plan view of an input sensing layer ISL according to an exemplary embodiment of the inventive concept. FIG. 9B is a partial plan view of the input sensing layer ISL according to an exemplary embodiment of the inventive concept. Hereinafter, detailed descriptions with respect to the same constituent as that described with reference to FIGS. 1 to 7J will be omitted.

FIGS. 8 and 9A are plan views of a plane corresponding to FIG. 7G. In FIGS. 8 and 9A, a connection relationship between the 1-th signal line SG1-1 of the first signal line group SG1 and the corresponding electrodes of the first electrode group EG1 is illustrated as an example. Also, this may be equally applied to the connection relationship between other signal lines of the first signal line group SG1 and the corresponding electrodes.

As illustrated in FIG. 8, the signal line of the first signal line group SG1 may be directly connected to the corresponding electrode of the first electrode group EG1. The fourth portion SG1-14 of the 1-th signal line SG1-1 is directly connected to the 2-th electrode IE1-2 of the first electrode group EG1. The fourth portion SG1-14 of the 1-th signal line SG1-1 is formed through the same process as the 2-th electrode IE1-2 of the first electrode group EG1. The fourth portion SG1-14 of the 1-th signal line SG1-1 and the 2-th electrode IE1-2 of the first electrode group EG1 may be formed from the second conductive layer IS-CL2 of FIG. 6A.

As illustrated in FIG. 9A, the fourth portion SG1-14 of the 1-th signal line SG1-1 is disposed to be spaced from the 2-th electrode IE1-2 of the first electrode group EG1 in the second direction DR2. The connection electrode CNE connects the fourth portion SG1-14 of the 1-th signal line SG1-1 to the 2-th electrode IE1-2 of the first electrode group EG1.

As illustrated in FIG. 9B, the connection electrode CNE is disposed on a layer different from that of the fourth portion SG1-14 of the 1-th signal line SG1-1 and the second electrode IE1-2 of the first electrode group EG1. The second insulation layer IS-IL2 covers the connection electrode CNE. The connection electrode CNE may be formed from the first conductive layer IS-CL1 (see FIG. 6A). The fourth portion SG1-14 of the 1-th signal line SG1-1 and the 2-th electrode IE1-2 of the first electrode group EG1 may be respectively connected to the connection electrode CNE through contact holes CNT-I passing through the second insulation layer IS-IL2.

As illustrated in FIG. 9B, a dummy pattern GRP may be disposed between the fourth portion SG1-14 of the 1-th signal line SG1-1 and the 2-th electrode IE1-2 of the first electrode group EG1. The dummy pattern GRP may be formed from the second conductive layer IS-CL2. The dummy pattern GRP may overlap and cross the connection electrode CNE on the plane.

The dummy pattern GRP may receive a bias voltage, for example, a ground voltage. The dummy pattern GRP may be a signal line disposed between the 1-th to k-th signal lines SG1-1 to SG1-*k* of the first signal line group SG1 and the corresponding electrodes of the first electrode group EG1. The dummy pattern GRP may extend to be disposed between the 1-th to k-th signal lines of the second signal line group SG2 and the corresponding electrodes of the first electrode group EG1. Substantially, the dummy pattern GRP may be a signal line extending along the sensing area IS-DA.

Figure 10A:
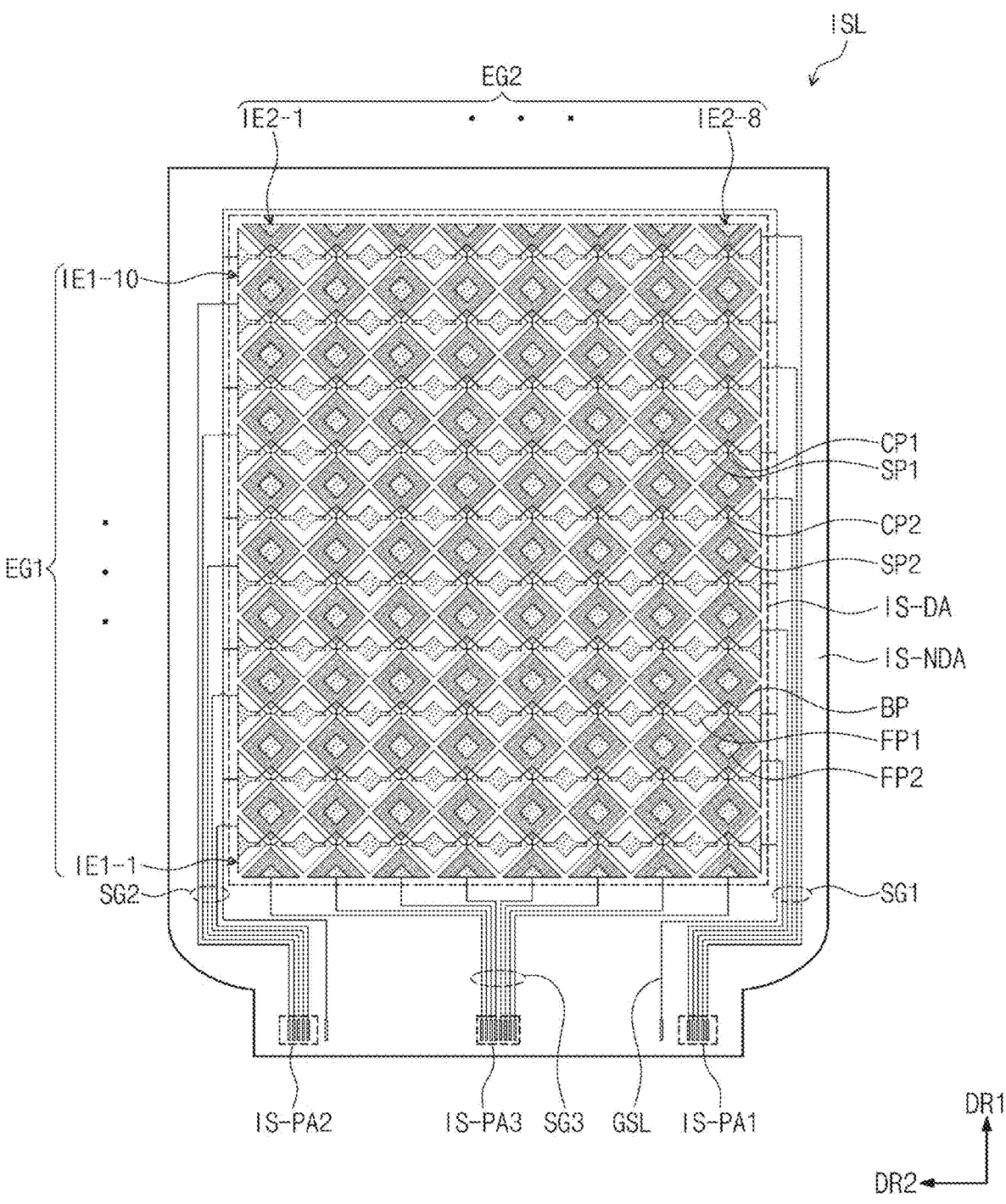
FIG. 10A is a plan view of an input sensing layer according to an exemplary embodiment of the inventive concept.
Figure 10B:
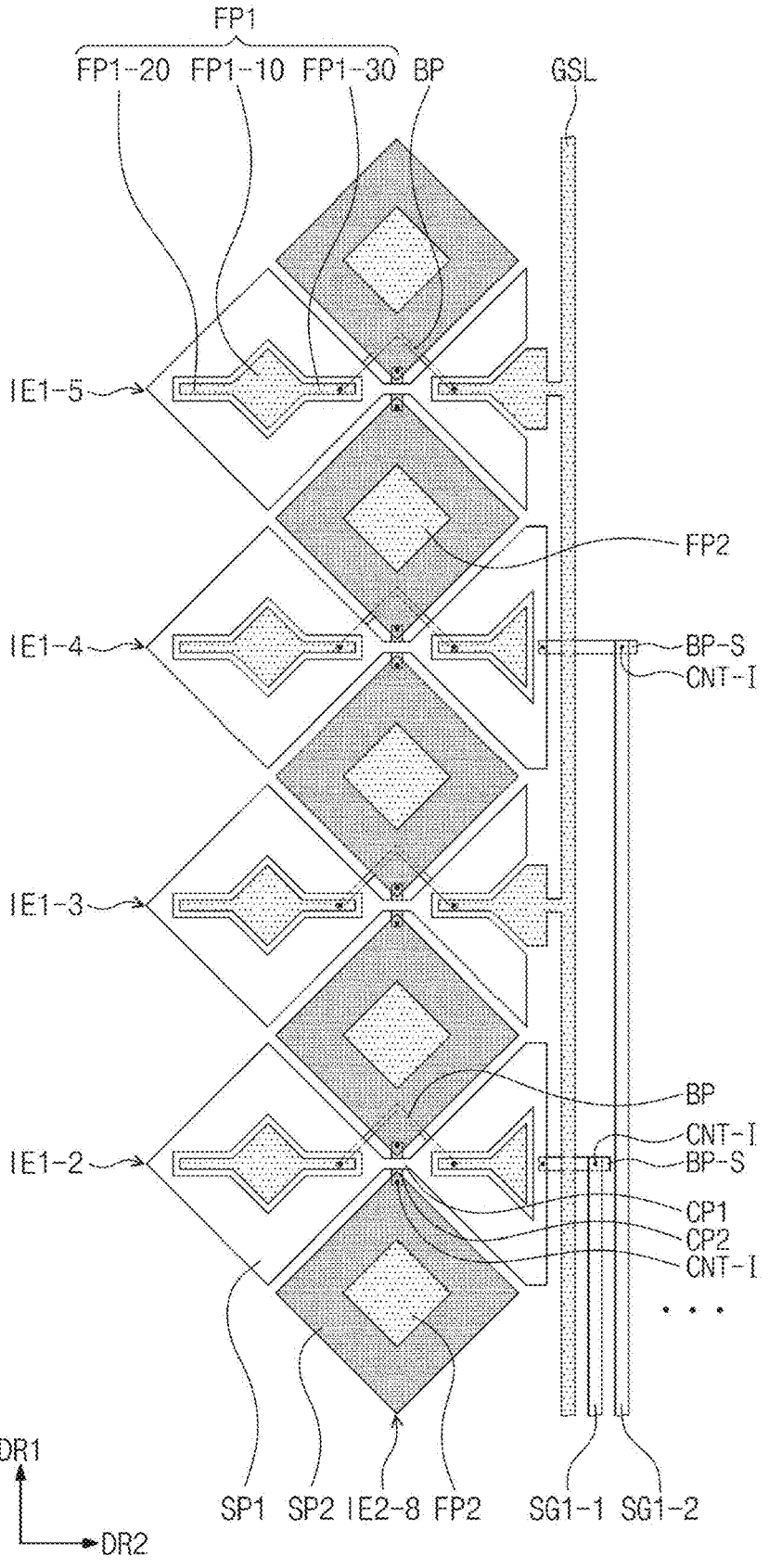
FIG. 10B is an enlarged plan view of a partial area of FIG. 10A.
Figure 10C:
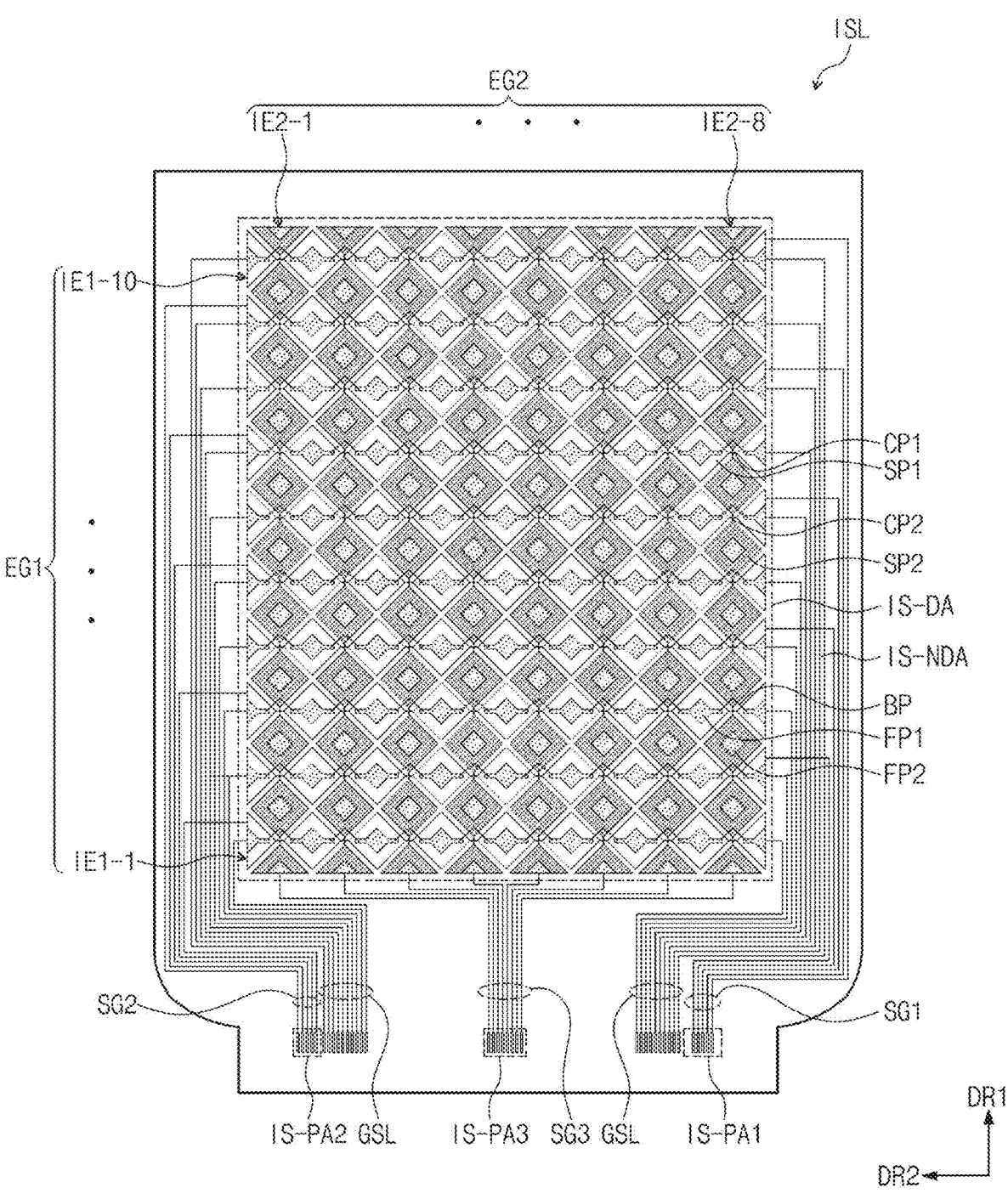
FIG. 10C is a plan view of an input sensing layer according to an exemplary embodiment of the inventive concept.

FIG. 10A is a plan view of an input sensing layer ISL according to an exemplary embodiment of the inventive concept. FIG. 10B is an enlarged plan view of a partial area of FIG. 10A. FIG. 10C is a plan view of an input sensing layer ISL according to an exemplary embodiment of the inventive concept. Hereinafter, detailed descriptions with respect to the same constituent as that described with reference to FIGS. 1 to 9B will be omitted.

As illustrated in FIG. 10A, the input sensing layer ISL may further include first floating patterns FP1 disposed inside the first sensing parts SP1 and second floating patterns FP2 disposed inside the second sensing parts SP2. The first floating patterns FP1 and the second floating patterns FP2 may reduce a parasitic cap between the input sensing layer ISL and the display panel DP (e.g., see FIG. 6A).

The input sensing layer ISL may further include floating connection parts BP (hereinafter, referred to as third connection parts) connecting the first floating patterns FP1. The third connection parts BP may be formed from the first conductive layer IS-CL1 of FIG. 6A. The third connection parts BP may overlap the second sensing part SP2.

As illustrated in FIG. 10A, the input sensing layer ISL (an input sensor) may further include a dummy signal line GSL. The dummy signal line GSL may receive a predetermined bias voltage, for example, a ground voltage. The dummy signal line GSL may be connected to the first floating patterns FP1. The dummy signal line GSL may receive electrical signals for sensing noise in the sensing area IS-DA. The dummy pattern GRP of FIG. 9B may be a portion of the dummy signal line GSL.

The dummy signal line GSL may be formed from the second conductive layer IS-CL2 of FIG. 6A. A signal line connection part BP-S (hereinafter, referred to as a fourth connection part) may be disposed in a crossing area between the dummy signal line GSL and the first and second signal line groups SG1 and SG2.

FIG. 10B illustrates an enlarged view of a portion of the first sensing electrodes (electrodes) IE1-2 to IE1-5 and the rightmost second sensing electrode (electrode) IE2-8. The dummy signal line GSL may be directly connected to the first floating patterns FP1 disposed inside the odd-numbered first sensing electrodes IE1-3 and IE1-5. The even-numbered first sensing electrodes IE1-2 and IE1-4 may be connected to corresponding signal lines SG1-1 and SG1-2 through the fourth connection part BP-S. The fourth connection part BP-S may be formed from the first conductive layer IS-CL1 of FIG. 6A.

As illustrated in FIG. 10B, at least one of the first floating patterns FP1 may include a central part FP1-10 and extension parts FP1-20 and FP1-30 disposed on both sides of the central part FP1-10 in the second direction DR2. Each of the extension parts FP1-20 and the FP1-30 is connected to the corresponding third connection part BP. The first floating patterns FP1 disposed on both ends of the first floating patterns FP1 in the second direction DR2 may have shapes different from those of other first floating patterns FP1. The first floating patterns FP1 disposed on the ends may include the central part and only one extension part disposed on one side of the central part.

As illustrated in FIG. 10C, the dummy signal line GSL may be provided in plurality. The same number of dummy signal lines GSL as the electrodes of the first electrode group EG1 may be disposed. Each of the dummy signal line GSL may be connected to the first floating patterns FP1 disposed inside the corresponding first sensing electrode.

Figure 11A:
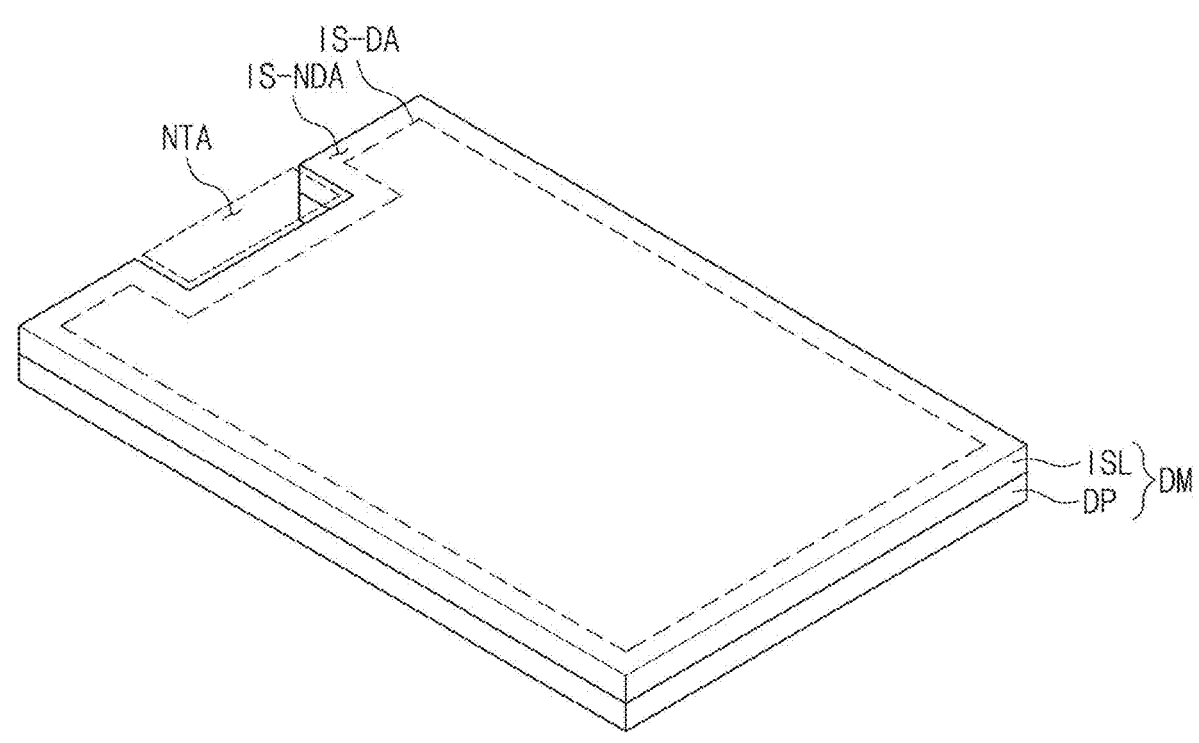
FIG. 11A is a perspective view of a display module according to an exemplary embodiment of the inventive concept.
Figure 11B:
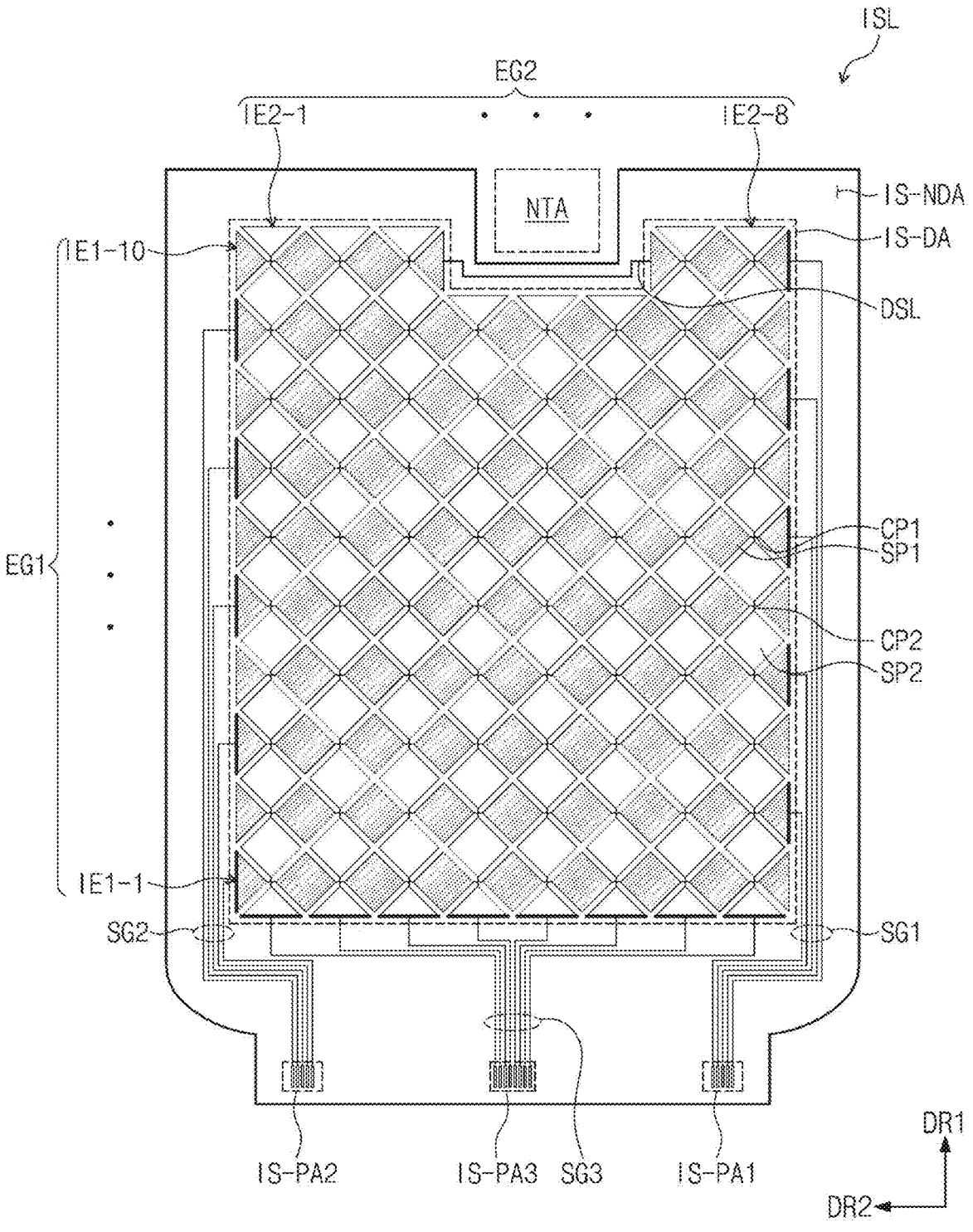
FIG. 11B is a plan view of an input sensing layer according to an exemplary embodiment of the inventive concept.
Figure 12A:
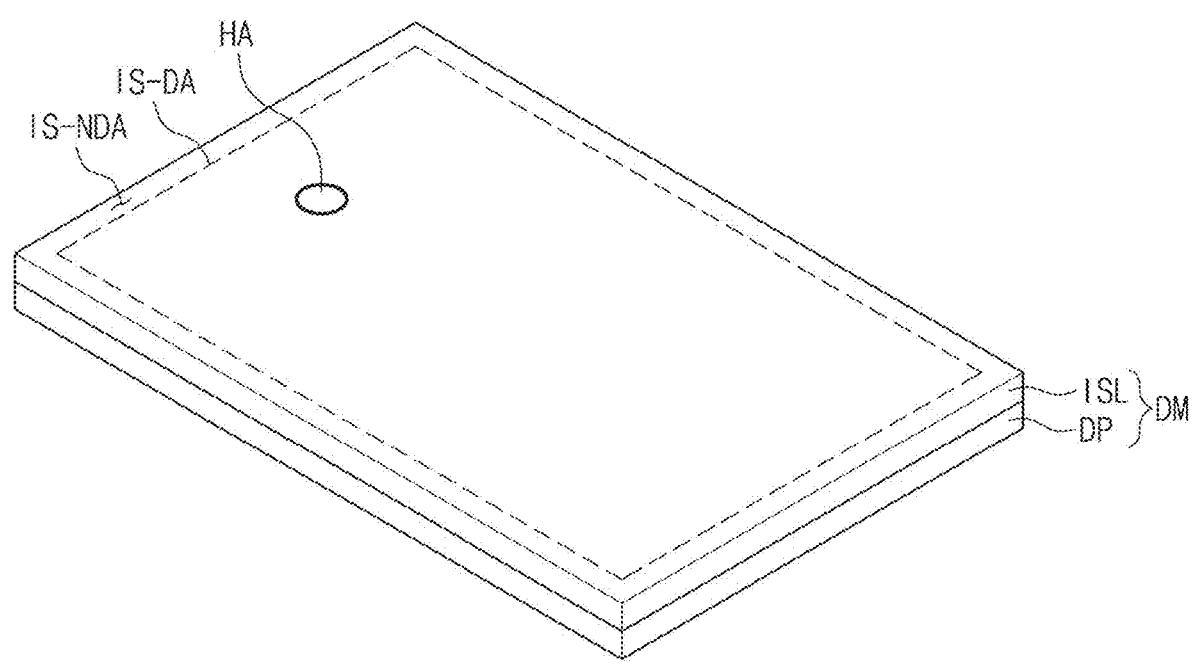
FIG. 12A is a perspective view of a display module according to an exemplary embodiment of the inventive concept.
Figure 12B:
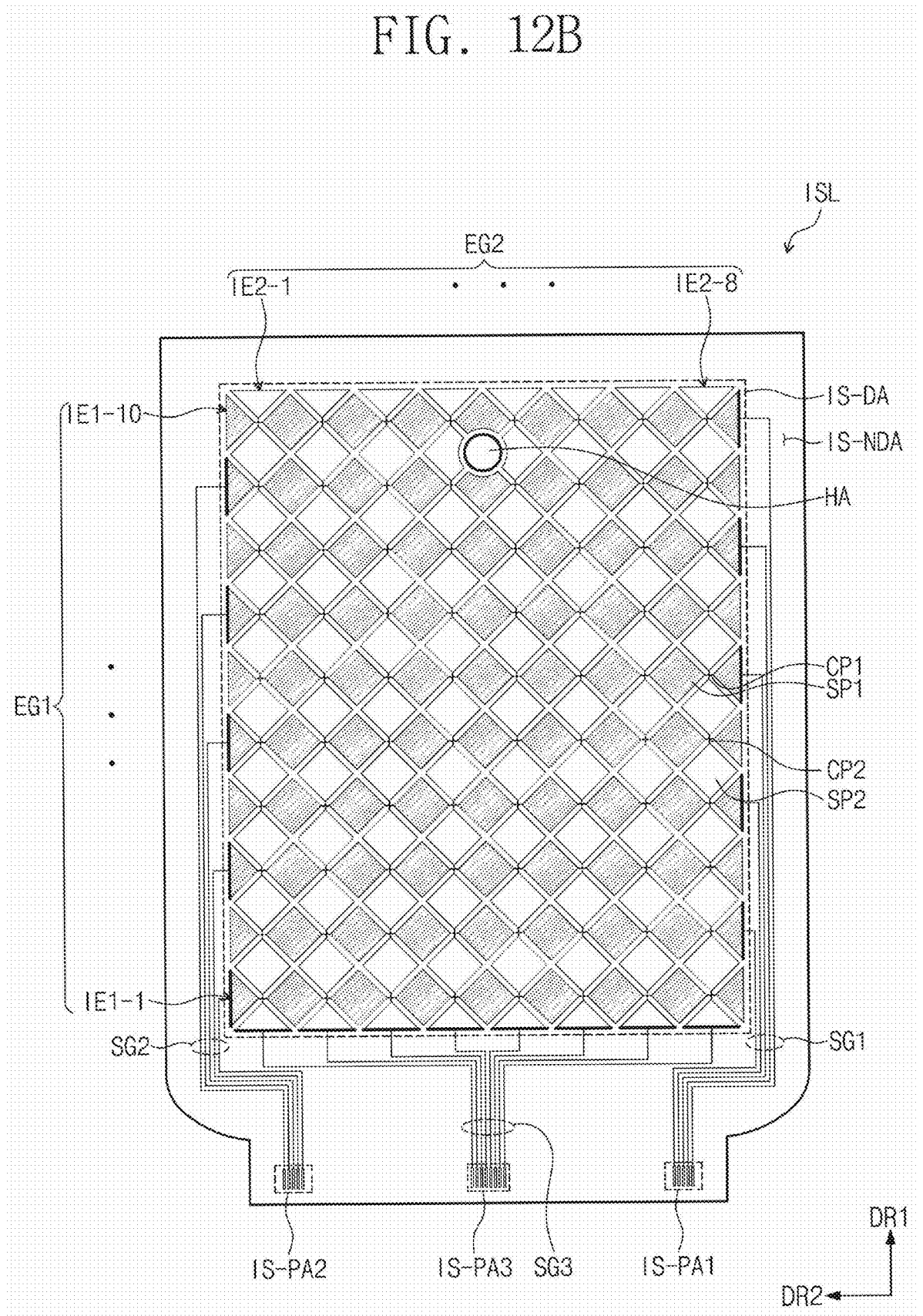
FIG. 12B is a plan view of an input sensing layer according to an exemplary embodiment of the inventive concept.

FIG. 11A is a perspective view of a display module DM according to an exemplary embodiment of the inventive concept. FIG. 11B is a plan view of an input sensing layer ISL according to an exemplary embodiment of the inventive concept. FIG. 12A is a perspective view of a display module DM according to an exemplary embodiment of the inventive concept. FIG. 12B is a plan view of an input sensing layer ISL according to an exemplary embodiment of the inventive concept. In FIGS. 11A to 12B, a "layer"-type input sensor is illustrated as an example.

As illustrated in FIG. 11A, the display module DM has a notching area NTA that is recessed inward on the plane. The notching area NTA may be defined in each of the display panel DP and the input sensing layer ISL. Here, the notching areas NTA need not be the same. The notching area NTA may be defined in a central area in the second direction DR2. However, the inventive concept is not limited to the notching area NTA defined in the central portion.

As illustrated in FIG. 11B, the first and second electrode groups EG1 and EG2 may be deformed in shape by the notching area NTA. The disposition and arrangement of the first and second signal line groups SG1 and SG2 may be substantially the same as the input sensing layer ISL of FIG. 6B.

As illustrated in FIG. 11B, since the notching area NTA is formed, the 10-th electrode IE1-10 may be divided into two portions. The two portions may be connected to each other by the dummy connection line DSL. Each of the 4-th to 6-th electrodes IE2-4 to IE-2-6 of the second electrode group EG2 may have a length less than that of each of other electrodes.

As illustrated in FIG. 12A, the display module DM has a hole area HA that is recessed inward on the plane. A portion of each of the display panel DP and the input sensing layer ISL may be removed to define the hole area HA. The hole areas HA of the display panel DP and the input sensing layer ISL need not be the same. The hole area HA may be a moving path for an optical signal. A plurality of hole areas HA may be defined in the display module DM.

The hole area HA of the display panel DP may be defined by removing a portion of the display panel DP corresponding to the plurality of emission areas PXA (see FIG. 5A) or defined through non-deposition. The hole area HA of the input sensing layer ISL may be an area which is formed by removing a portion of the sensing parts SP1 and SP2 or in which the sensing parts SP1 and SP2 are not formed.

As illustrated in FIG. 12B, the first and second electrode groups EG1 and EG2 may be deformed in shape by the hole area HA. The disposition and arrangement of the first and second signal line groups SG1 and SG2 may be substantially the same as the input sensing layer ISL of FIG. 6B.

The hole area HA of the input sensing layer ISL may be disposed in a crossing area between the first and second electrode groups EG1 and EG2. Here, a dummy connection line (not shown) may be disposed around the hole area HA of the input sensing layer ISL. For example, the dummy connection line may bypass the hole area HA to connect the electrodes in the first electrode group EG1 to each other and to connect the electrodes in the second electrode group EG2 to each other.

According to the inventive concept, the signal line having the maximum resistance of the input sensor may be reduced in resistance value. The signal lines may be reduced in resistance deviation.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
a display device; and
a main board electrically connected to the display device,
the display device comprising:
a display panel; and
an input sensor disposed above the display panel and comprising a sensing area and a line area,
wherein:
the input sensor comprises:
a first electrode group disposed in the sensing area and comprising 1-th to i-th (where i is a natural number of 2 or more) electrodes arranged away from a pad area defined at one side of the line area, wherein each of the 1-th to i-th electrodes is extended in a first direction;
a second electrode group disposed in the sensing area and comprising a plurality of electrodes, wherein each of the plurality of electrodes is extended in a second direction crossing the first direction; and
a first signal line group disposed in the line area, electrically connected to the first electrode group, and comprising 1-th to k-th (where k is a natural number and less than i) signal lines;
each of the 1-th to k-th signal lines of the first signal line group comprises:
a first extension portion extended in the first direction and disposed between the sensing area and the pad area in the second direction; and
an inflection portion extended from the first extension portion and disposed outside a corner area of the sensing area;
the 1-th to k-th signal lines are sequentially connected to some electrodes of the 1-th to i-th electrodes;

the first extension portions of the 1-th to k-th signal lines have widths that increase from the 1-th signal line toward the k-th signal line; and
an end portion of the inflection portion of the 1-th signal line extending in the second direction is directly connected to a corresponding electrode extended in the first direction of the 1-th to i-th electrodes along the end portion of the inflection portion of the 1-th signal line.

2. The electronic device of claim 1, wherein:
n-th to k-th signal lines of the 1-th to k-th signal lines further comprise a second extension portion extended in the second direction;
n is a natural number and more than 1 and less than k;
the inflection portion of the n-th to k-th signal lines are disposed between the first extension portion and the second extension portion; and
the second extension portions of the n-th to k-th signal lines have the same width.

3. The electronic device of claim 1, wherein each of the 1-th to k-th signal lines further comprises a pad portion extending from the first extension portion in the second direction to partially overlap the pad area.

4. The electronic device of claim 3, wherein the pad portions of the 1-th to k-th signal lines have the same width.

5. The electronic device of claim 1, wherein the display panel comprises:
a base layer;
a transistor on the base layer;
a display element on the base layer and electrically connected to the transistor; and
an encapsulation layer on the base layer and overlapped with the display element; and
the input sensor is directly disposed on the encapsulation layer.

6. The electronic device of claim 1, wherein the corner area of the sensing area has a curved shape.

7. The electronic device of claim 1, wherein the inflection portion has a curved shape or at least one inflection point at which an extension direction is changed.

8. The electronic device of claim 1, wherein the electronic device is a mobile terminal, a television, a monitor, a tablet PC, a navigation unit for a vehicle, a game console, or a smart watch.

9. An electronic device comprising:
a display device; and
a main board electrically connected to the display device,
the display device comprising:
a display panel; and
an input sensor disposed above the display panel and comprising a sensing area and a line area,
wherein:
the input sensor comprises:
a first electrode group disposed in the sensing area and comprising 1-th to i-th (where i is a natural number of 2 or more) electrodes arranged away from a pad area defined at one side of the line area, wherein each of the 1-th to i-th electrodes is extended in a first direction;
a second electrode group disposed in the sensing area and comprising a plurality of electrodes, wherein each of the plurality of electrodes is extended in a second direction crossing the first direction; and
a first signal line group disposed in the line area, electrically connected to the first electrode group, and comprising 1-th to k-th (where k is a natural number and less than i) signal lines;

each of the 1-th to k-th signal lines of the first signal line group comprises:

a first extension portion extended in the first direction and disposed between the sensing area and the pad area in the second direction; and an inflection portion extended from the first extension portion and disposed outside a corner area of the sensing area;

wherein the 1-th to k-th signal lines are sequentially connected to some electrodes of the 1-th to i-th electrodes;

the first extension portions of the 1-th to k-th signal lines have widths that increase from the 1-th signal line toward the k-th signal line; and the inflection portion of the 1-th signal line is directly connected to a corresponding electrode of the 1-th to i-th electrodes, wherein:

n-th to k-th signal lines of the 1-th to k-th signal lines further comprise a second extension portion extended in the second direction;

n is a natural number and more than 1 and less than k;

the inflection portion of the n-th to k-th signal lines are disposed between the first extension portion and the second extension portion; and the second extension portions of the n-th to k-th signal lines have the same width, and wherein the inflection portion comprises:

a first portion extending from the first extension portion and having a width different from a width of the first extension portion;

a second portion extending from the first portion and having a width gradually varying in a direction that is away from the first portion; and a third portion extending from the second portion and having a width different from the width of the second portion.

10. The electronic device of claim 9, wherein the third portions of the 1-th to k-th signal lines have the same width.

11. The electronic device of claim 9, wherein the third portion of each of the 1-th to k-th signal lines has a constant width.

12. The electronic device of claim 9, wherein the input sensor further comprises a connection electrode connecting the third portion of the 1-th signal line to a corresponding electrode of the 1-th to i-th electrodes.

13. The electronic device of claim 12, wherein:

the connection electrode and the 1-th signal line are disposed with an insulation layer therebetween;

the insulation layer is disposed below the 1-th signal line and the corresponding electrode; and each of the third portion of the 1-th signal line and the corresponding electrode are connected to the connection electrode through connection contact holes passing through the insulation layer.

14. The electronic device of claim 13, wherein:

the input sensor further comprises a dummy pattern disposed between the corresponding electrode and the third portion of the 1-th signal line on a plane;

the dummy pattern is spaced apart from each of the corresponding electrode and the third portion of the 1-th signal line; and the dummy pattern overlaps the connection electrode.

15. The electronic device of claim 9, wherein:

each of the n-th to k-th signal lines further comprises a fourth portion extending from the third portion and between the third portion and the second extension portion; and the fourth portion has a width that gradually increases in a direction that is away from the third portion.

16. The electronic device of claim 15, wherein the inflection portion of each of the 1-th to k-th signal lines has a constant width.

17. The electronic device of claim 16, wherein a width of an area of the line area in which the third portions of the 1-th to k-th signal lines are disposed and a width of an area of the line area in which the second extension portion of the n-th to k-th signal lines are disposed are the same.

18. The electronic device of claim 17, wherein the second extension portion has a width greater than that of the third portion.

19. The electronic device of claim 9, wherein the electronic device is a mobile terminal, a television, a monitor, a tablet PC, a navigation unit for a vehicle, a game console, or a smart watch.

* * * * *